(12) United States Patent
Kanagawa et al.

(10) Patent No.: US 8,146,246 B2
(45) Date of Patent: Apr. 3, 2012

(54) METHOD OF MANUFACTURING A WIRED CIRCUIT BOARD

(75) Inventors: Hitoki Kanagawa, Osaka (JP); Tetsuya Ohsawa, Osaka (JP); Yasunari Ooyabu, Osaka (JP)

(73) Assignee: Nitto Denko Corporation, Osaka (JP)

( * ) Notice: Subject to any disclaimer, the term of this patent is extended or adjusted under 35 U.S.C. 154(b) by 0 days.

(21) Appl. No.: 12/929,520

(22) Filed: Jan. 31, 2011

(65) Prior Publication Data

US 2011/0119911 A1 May 26, 2011

Related U.S. Application Data

(60) Division of application No. 12/081,835, filed on Apr. 22, 2008, now Pat. No. 8,015,703, which is a continuation of application No. 11/236,815, filed on Sep. 28, 2005, now Pat. No. 7,732,900.

(30) Foreign Application Priority Data

Oct. 21, 2004 (JP) ................................. 2004-307265

(51) Int. Cl.
*H01R 9/00* (2006.01)
*H05K 3/00* (2006.01)

(52) U.S. Cl. ................. 29/842; 29/825; 29/829; 29/874

(58) Field of Classification Search ........... 29/842, 29/825, 829, 846, 874, 878; 174/250, 255, 174/258, 262
See application file for complete search history.

(56) References Cited

U.S. PATENT DOCUMENTS

| | | |
|---|---|---|
| 5,572,346 A | 11/1996 | Sakamoto et al. |
| 5,668,405 A | 9/1997 | Yamashita |
| 5,715,144 A | 2/1998 | Ameen et al. |
| 5,838,519 A | 11/1998 | Takizawa et al. |
| 6,098,271 A | 8/2000 | Yamamoto et al. |
| 6,201,667 B1 | 3/2001 | Yamamoto et al. |
| 6,388,201 B2 | 5/2002 | Yamato et al. |
| 6,448,506 B1 | 9/2002 | Glenn et al. |
| 7,304,247 B2 * | 12/2007 | Birgel et al. ................. 174/260 |
| 2002/0007961 A1 | 1/2002 | Yamato et al. |
| 2002/0127839 A1 | 9/2002 | Umetsu et al. |
| 2003/0007331 A1 | 1/2003 | Kataoka |
| 2004/0155324 A1 | 8/2004 | Sasaki |
| 2004/0217455 A1 | 11/2004 | Shiono et al. |

(Continued)

FOREIGN PATENT DOCUMENTS

CN 2360949 Y 1/2000

(Continued)

*Primary Examiner* — Thiem Phan
(74) *Attorney, Agent, or Firm* — Jean C. Edwards, Esq.; Edwards Neils PLLC

(57) ABSTRACT

A method of manufacturing a wired circuit board, including: forming an insulating layer in a pattern thereby forming second through holes penetrating the insulating layer in a thickness direction thereof; and after forming the insulating layer, forming, on the insulating layer, a conductive pattern in a pattern having terminals which are continuous with an upper surface and a side surface of a side end portion of the insulating layer such that the terminals extend into the second through holes. The terminals are operative for connecting with external terminals via a molten metal. The terminals include annular, step-shaped shoulder portions aligned with the second through holes and that are recessed downward from an upper surface, and first through holes having a diameter smaller than that of the second through holes and which pass through the terminals in a thickness direction thereof.

3 Claims, 19 Drawing Sheets

U.S. PATENT DOCUMENTS

| | | | |
|---|---|---|---|
| 2005/0006140 A1 | 1/2005 | Birgel et al. | |
| 2007/0114653 A1 | 5/2007 | Shiono et al. | |

FOREIGN PATENT DOCUMENTS

| | | |
|---|---|---|
| DE | 195 28 270 A1 | 10/1994 |
| EP | 0 702 404 A2 | 3/1996 |
| JP | 5-53144 | 7/1993 |
| JP | 7-199207 | 8/1995 |
| JP | 8-88245 | 4/1996 |
| JP | 10-256688 | 9/1998 |
| JP | HEI 11-266066 | 9/1999 |
| JP | 2001-350272 | 12/2001 |
| JP | 2001-352137 | 12/2001 |
| JP | 2002-270718 | 9/2002 |
| JP | 2002-280732 | 9/2002 |
| JP | 2002-368370 | 12/2002 |
| WO | WO 02/100140 A2 | 12/2002 |
| WO | WO 03/007370 | 1/2003 |

* cited by examiner

METHOD OF MANUFACTURING A WIRED CIRCUIT BOARD

CROSS-REFERENCE TO RELATED APPLICATIONS

The present application is a Divisional Application of U.S. patent application Ser. No. 12/081,835, filed Apr. 22, 2008 now U.S. Pat. No. 8,015,703, which is a continuation of U.S. patent application Ser. No. 11/236,815, filed Sep. 28, 2005, now U.S. Pat. No. 7,732,900, which claims priority from Japanese Patent Application No. 2004-307265, filed Oct. 21, 2004, the contents of which are herein incorporated by reference in their entirety.

BACKGROUND OF THE INVENTION

1. Field of the Invention

The present invention relates to a wired circuit board and, more particularly, to a wired circuit board having terminals to be connected to external terminals through molten metal.

2. Description of the Prior Art

A wired circuit board usually has terminals to be connected to external terminals as a part of a conductive pattern.

Molten metal, such as, for example, solder balls, is used for connecting the terminals of the wired circuit board to the external terminals. The solder balls are placed on the terminals and are melted on the surfaces of the terminals, whereby the terminals of the wired circuit board are connected to the external terminals through the solder balls.

When the terminals have flat surfaces, the solder balls can roll around the surfaces of the terminals. The prior art proposes an attempted solution wherein electrodes (terminals) formed on the substrate are provided, at center portions thereof, with cavities to place the solder balls on the electrodes stably (Cf. JP Laid-open (Unexamined) Patent Publication No. 11-266066 (1999), for example).

In this prior art of JP Laid-open (Unexamined) Patent Publication No. 11-266066 (1999), the electrodes are formed as ring-shaped electrodes and the cavities are formed at the center portions of the ring-shaped electrodes, while the substrate is exposed from lower ends of the cavities, in other words, the cavities are closed by the substrate.

On the other hand, when the electrodes are connected to the external terminals through the solder balls, the substrate of the wired circuit board and an external substrate must be placed to confront each other so that the solder balls can be sandwiched therebetween. However, when the substrate and the external substrate are placed to confront each other, it cannot disadvantageously be seen whether the solder balls are precisely set in the cavities in the electrodes, because the cavities are closed by the substrate, so the solder balls get behind the substrate.

SUMMARY OF THE INVENTION

It is the object of the invention to provide a wired circuit board having terminals that can provide reliable placement of molten metals on the terminals, to connect between the terminals and the external terminals with a high degree of precision.

The present invention provides a wired circuit board comprising an insulating layer and a conductive pattern formed on the insulating layer, wherein the conductive pattern includes terminals to be connected with external terminals through molten metal, wherein first holes to be filled with the molten metals are formed in the terminals to extend through the terminals in a thickness direction thereof, and wherein second holes to communicate with the first holes are formed in the insulating layer at portions thereof corresponding to the terminals, to extend through the insulating layer in a thickness direction thereof.

In the wired circuit board of the present invention, it is preferable that a metal supporting layer is provided on the other side of the insulating layer opposite one side thereof on which the conductive pattern is provided, and third holes to communicate with the second holes are formed in the metal supporting layer to extend through the metal supporting layer in a thickness direction thereof.

According to the wired circuit board of the present invention, the first holes to be filled with molten metals are formed in the terminals, and the second holes to communicate with the first holes are formed in the insulating layer. This can provide the result that when the terminals are connected to the external terminals, the connection between the terminals and the external terminals can be performed while confirming the placement of the molten metals or the external terminals from the first and second holes. This can provide reliable placement of molten metals on the terminals, to connect between the terminals and the external terminals with a high degree of precision.

DETAILED DESCRIPTION OF THE PREFERRED EMBODIMENTS

Figure 1:
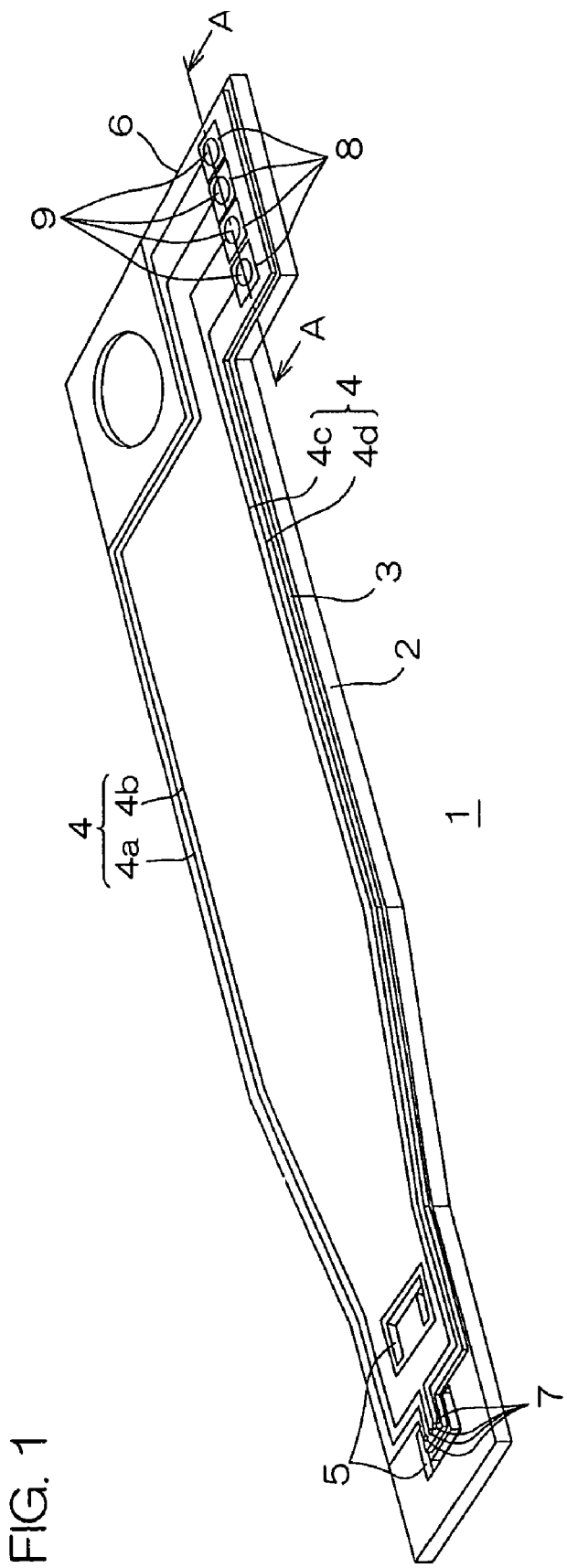
FIG. 1 is a perspective view showing a suspension board with circuit presented as an embodiment of a wired circuit board of the present invention.

FIG. 1 is a perspective view showing a suspension board with circuit presented as an embodiment of a wired circuit board of the present invention.

In FIG. 1, the suspension board with circuit 1 is designed to mount a magnetic head of a hard disc drive (not shown) thereon and hold it against an airflow generated when the magnetic head and a magnetic disk run relative to each other, while supporting the magnetic head closely spaced from the magnetic disc. A conductive pattern 4 for connecting between the magnetic head and a read-write substrate is integrally formed with the suspension board with circuit 1.

This suspension board with circuit 1 comprises a supporting board 2 serving as a metal supporting layer, an insulating base layer 3 serving as an insulating layer formed on the supporting board 2, and a conductor layer 4 formed on the insulating base layer 3.

The supporting board 2 is formed by a thin plate extending longitudinally. The supporting board 2 has a gimbal 5, formed at a front end portion thereof, for mounting the magnetic head, and a terminal arranging portion 6, formed at a rear end portion thereof, for arranging external connecting terminals 8 mentioned later along a longitudinal direction of the supporting board 2. The terminal arranging portion 6 is formed to protrude to one widthwise side of the supporting board 2 (orthogonal to the longitudinal direction of the supporting board 2).

The insulating base layer 3 includes a part of the supporting board 2 where the conductive pattern 4 is formed, and is formed in the form of a predetermined pattern.

The conductive pattern 4 comprises a number of lines of wire 4a, 4b and 4c, 4d, magnetic head connecting terminals 7, and external connecting terminals 8 serving as a terminal portion, which are formed in a unified manner. The lines of wire 4a, 4b, 4c, 4d are extended along the longitudinal direction of the supporting board 2 and are arranged in parallel at spaced intervals with respect to the widthwise direction.

The magnetic head connecting terminals 7 are arranged at the front end portion of the supporting board 2 to correspond to the respective lines of wire 4a, 4b, 4c, and 4d. The magnetic head connecting terminals 7 are integrally formed with the supporting board 2 to continuously extend from front end portions of the respective lines of wire 4a, 4b, 4c, 4d and are spaced apart from each other along the widthwise direction of the supporting board 2. The magnetic head (not shown) is mounted on the magnetic head connecting terminals 7.

Figure 6:
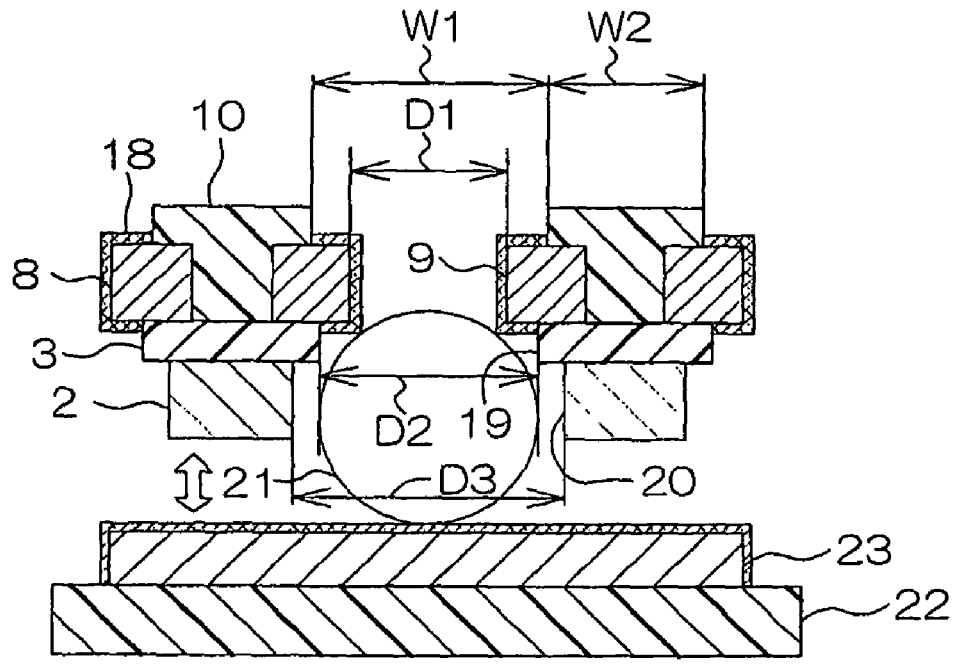
FIG. 6 is a sectional view of a principal part of an illustrative embodiment of the present invention, explaining the connection between an external connecting terminal of the suspension board with circuit shown in FIG. 1 and an external terminal of an external circuit.

The external connecting terminals 8 are arranged in the terminal arranging portion 6 at the rear end portion of the supporting board 2 to correspond to the lines of wire 4a, 4b, 4c, and 4d, respectively. The external connecting terminals 8 are integrally formed with the supporting board 2 to continuously extend from rear end portions of the respective lines of wire 4a, 4b, 4c, 4d and are spaced apart from each other along the longitudinal direction of the supporting board 2. The connection with the external connecting terminals 8 is performed using connecting terminals of a read/write board (not shown) serving as the external terminals and solder balls 21 (Cf. FIG. 6) serving as molten metal.

Each of the external connecting terminals 8 is formed in generally square form as viewed from top, and first through holes 9 are formed in the form of first holes for molten solder balls 21 to be filled in. The first through holes 9 are formed to extend through the external connecting terminals 8 in the thickness direction thereof, respectively (Cf. FIG. 6).

Also, second through holes 19 which are in the form of second holes to communicate with the first through holes 9, respectively, are formed in the insulating base layer 3 at regions thereof corresponding to the external connecting terminals 8. The second through holes 19 are formed in generally circular form as viewed from top larger than the first through holes 9, extending through the insulating base layer 3 in the thickness direction.

Further, third through holes 20 which are in the form of third holes to communicate with the second through holes 19, respectively, are formed in the supporting board 2 at regions thereof corresponding to the second through holes 19. The third through holes 20 are formed in generally circular form as viewed from top larger than the second through holes 19, extending through the supporting board 2 in the thickness direction.

Though not shown in FIG. 1, an insulating cover layer 10 formed in a predetermined pattern (Cf. FIG. 2(d)) is formed on the insulating base layer 3 to cover the conductive pattern 4.

Next, a production method of this suspension board with circuit 1 will be described with reference to FIGS. 2-5. It should be noted that FIGS. 2-5 each shows a sectional view of the terminal arranging portion 6 of the supporting board 2 taken along the longitudinal direction of the supporting board 2.

In this method, the supporting board 2 is prepared, first, as shown in FIG. 2(a). A metal foil or a thin metal sheet is used as the supporting board 2. For example, stainless steel, 42-alloy, aluminum, copper-beryllium, phosphor bronze, etc. are used as the metal used for the supporting board 2. Preferably, stainless foil is used in terms of rigidity, corrosion resistance and easiness in workability. The supporting board 2 has a thickness of e.g. 10-100 µm, or preferably 18-30 µm and a width of e.g. 50-500 mm, or preferably 125-300 mm.

Then, the insulating base layer 3 is formed in a predetermined pattern on the supporting board 2, as shown in FIG. 2(b).

No particular limitation is imposed on the insulating materials used for forming the insulating base layer 3. For example, synthetic resins, such as polyimide resin, polyamide imide resin, acrylic resin, polyether nitrile resin, polyether sulfonic resin, polyethylene terephthalate resin, polyethylene naphthalate resin, and polyvinyl chloride resin. Of these synthetic resins, polyimide resin is preferably used in terms of heat resistance and chemical resistance. In addition, photosensitive synthetic resin is preferably used in terms of easiness in fine processing of the pattern. Further preferably, photosensitive polyimide resin is used.

For example when photosensitive polyimide resin is used to form the insulating base layer 3 of the predetermined pattern on the supporting board 2, a solution of precursor of the photosensitive polyimide resin (photosensitive polyamic acid resin) is coated over the entire surface of the supporting board 2, as shown in FIG. 3(a). Then, it is heated at e.g. 60-150° C., or preferably at 80-120° C., to form a coating 11 of the precursor of the photosensitive polyimide resin.

Then, the coating 11 is exposed to light through a photo mask 12, as shown in FIG. 3(b). The photo mask 12 has a predetermined pattern comprising light shielding portions 12a and a total-light-transmitting portion 12b.

The photo mask 12 is disposed opposite the coating 11 so that the light shielding portions 12a confront portions of the coating 11 where the insulating base layer 3 is not to be formed on the supporting board 2 and the total-light-transmitting portions 12b confront portions of the coating 11 where the insulating base layer 3 is to be formed on the supporting board 2.

Preferably, light irradiated through the photo mask 12 (irradiated radiation) has an exposure wavelength of e.g. 300-450 nm, or preferably 350-420 nm. An integrated quantity of exposure light is preferably in the range of e.g. 100-2,000 mJ/cm$^2$.

Then, the coating 11 exposed to light is developed, after heated to a predetermined temperature, if necessary, as shown in FIG. 3(c). When the exposed-to-light portion of the coating 11 irradiated is heated at a temperature in the range of between e.g. 130° C. or more and less than 150° C., it is solubilized (positive type) in the next developing process. On the other hand, when heated at a temperature in the range of between e.g. 150° C. or more and 200° C. or less, it is insolubilized (negative type) in the next developing process.

Figure 3:
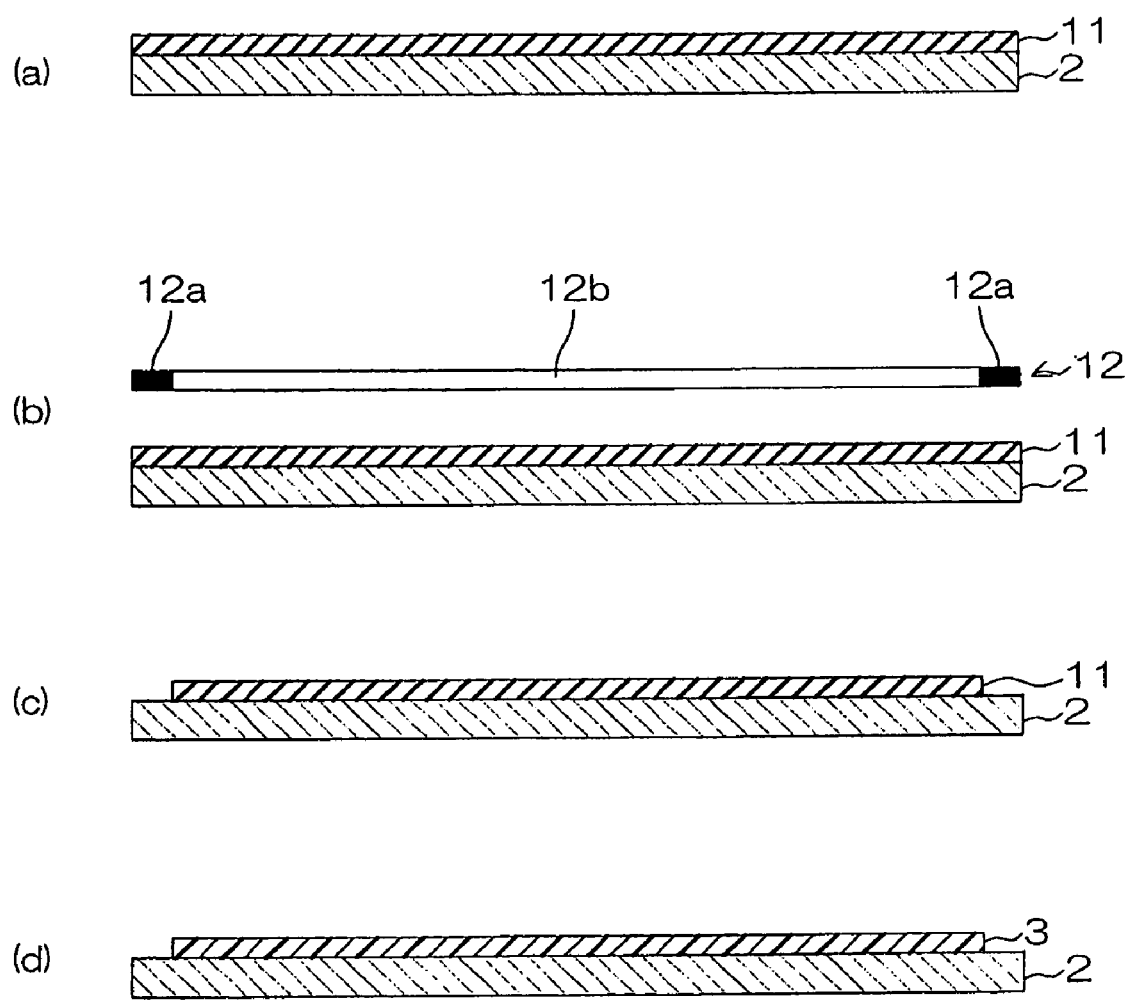
FIG. 3 is a detailed process drawing of the process of forming the insulating base layer on the supporting board shown in FIG. 2, (a) showing the process of forming a coating of precursor of photosensitive polyimide resin on the entire surface of the supporting board, (b) showing the process of exposing the coating to light through a photo mask, (c) showing the process of developing the coating, and (d) showing the process of curing the coating to form the insulting base layer of polyimide resin.

The development can be performed by any known method, such as a dipping process and a spraying process, using a known developing solution such as alkaline developer. In this method, it is preferable that the negative pattern is formed. Illustrated in FIG. 3 is an embodiment using the process steps for forming the negative pattern.

In this developing process, the coating 11 is melted at marginal portions thereof confronting the light shielding portions 12a of the photo mask 12, so that it is formed in such a predetermined pattern that the marginal portions of the supporting board 2 are exposed.

Then, the coating 11 formed in the predetermined pattern is heated finally to e.g. 250° C. or more to be cured (imidized). As a result, the insulating base layer 3 of polyimide resin is formed in such a predetermined pattern that the marginal portions of the supporting board 2 are exposed, as shown in FIG. 3(d).

As an alternative to using the photosensitive synthetic resin, for example the synthetic resin may be coated to form said pattern, or a dry film previously processed to have said pattern may be adhesively bonded to the supporting board 2 through an adhesive layer, if necessary.

The insulating base layer 3 thus formed has a thickness of e.g. 5-20 µm, or preferably 7-15 µm.

Then, the conductive pattern 4 is formed, as shown in FIG. 2(c). No particular limitation is imposed on the conductive materials used for the conductive pattern 4. For example, copper, nickel, gold, solder, or alloys thereof may be used. Copper is preferably used in terms of electrical conductivity, cost efficiency, and easiness in workability.

The conductive pattern 4 can be formed by a known patterning process, such as a subtractive process and an additive process. When the conductive pattern 4 is formed at fine pitch using the fine pitch technology, the additive process is preferably used.

In the additive process, a thin metal film 14 is formed as a seed film on a surface of the supporting board 2 exposed from the insulating base layer 3 and the entire surface of the insulating base layer 3, as shown in FIG. 4(a). The metal materials that may be used for the thin metal film 14 include, for example, chromium, nickel, copper, and alloys thereof. No particular limitation is imposed on the formation of the thin metal film 14. For example, the thin metal film 14 can be formed by a vacuum deposition process such as a sputtering process. Preferably, the thin metal film 14 has thickness of e.g. 100-2,000 Å. The thin metal film 14 may be formed in multilayer, for example, by forming a thin chromium film and a thin copper film sequentially by the sputtering process.

Then, a plating resist 15 having a reverse pattern to the conductive pattern 4 is formed on the thin metal film 14, as shown in FIG. 4(b). To be more specific, the plating resist 15 is formed on the surface of the thin metal film 14 so that the thin metal film 14 can be exposed at potions thereof corresponding to the lines of wire 4a, 4b, 4c, 4d, the magnetic head connecting terminals 7 and the external connecting terminals 8.

The plating resist 15 is formed to have the reverse pattern to the conductive pattern 4 by a known process using a dry film photoresist, for example.

Then, the conductive pattern 4 is formed on the surface of the thin metal film 14 exposed from the plating resist 15, as shown in FIG. 4(c). No particular limitation is imposed on the formation of the conductive pattern 4. For example, the conductive pattern 4 can be formed thereon by electrolytic plating, or preferably electrolytic copper plating.

Thereafter, the plating resist 15 is removed, as shown in FIG. 4(d). The plating resist 15 is removed, for example, by a known etching process, such as a chemical etching (wet etching), or by stripping.

Then, the thin metal film 14 exposed from the conductive pattern 4 is removed, as shown in FIG. 4(e). The thin metal film 14 is removed, for example, by the chemical etching (wet etching).

Figure 4:
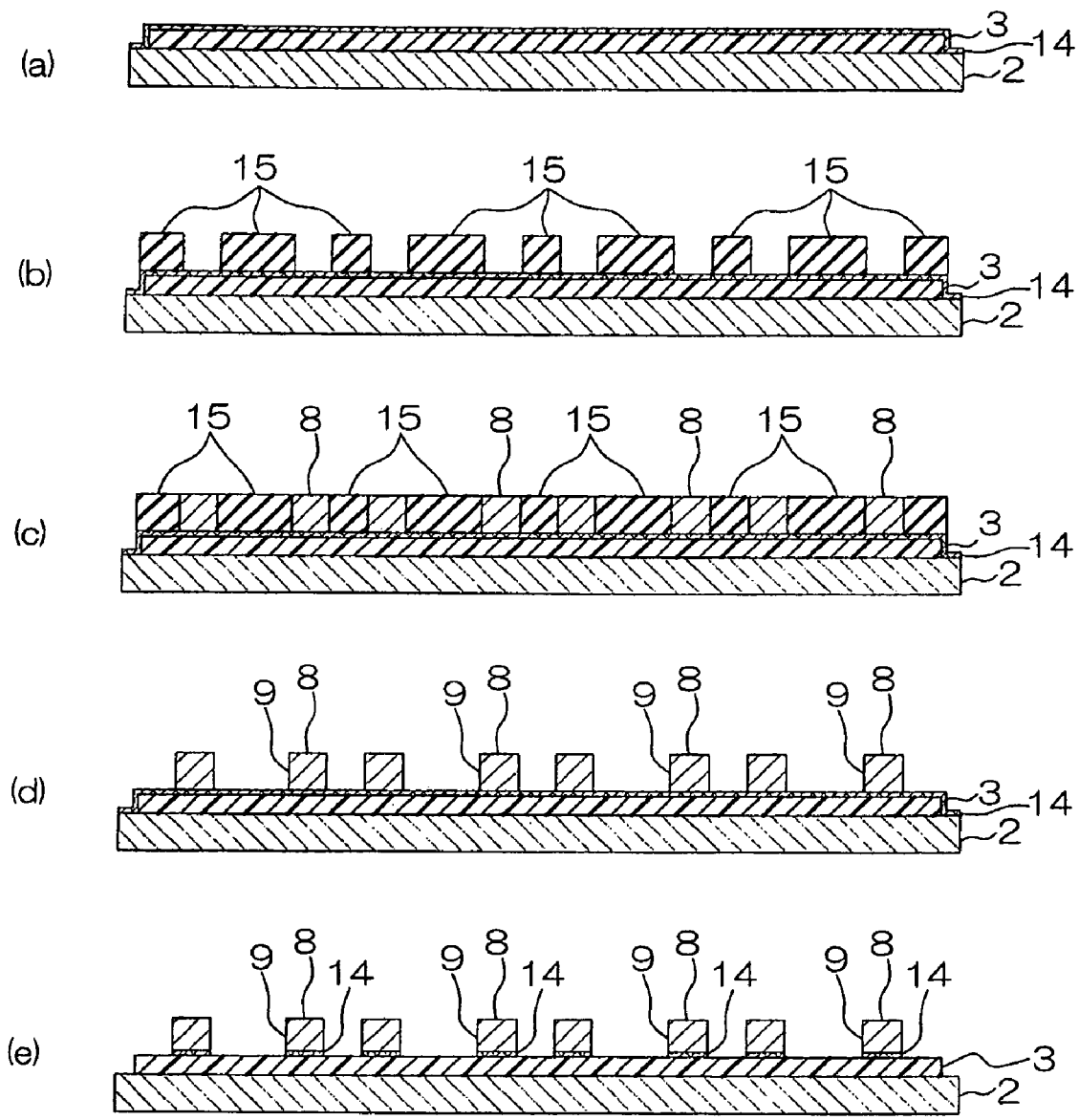
FIG. 4 is a detailed process drawing of the process of forming the conductive pattern on the insulating base layer shown in FIG. 2, (a) showing the process of forming a thin metal film on a surface of the supporting board exposed from the insulating base layer and on the entire surface of the insulating base layer, (b) showing the process of forming on a surface of the thin metal film a plating resist of a reverse pattern to the conductive pattern, (c) showing the process of forming the conductive pattern on the surface of the thin metal film exposed from the plating resist, (d) showing the process of removing the plating resist, and (e) showing the process of removing the thin metal film exposed from the conductive pattern.

After the processes mentioned above, the conductive pattern 4 including the lines of wire 4a, 4b, 4c, and 4d, the respective magnetic head connecting terminals 7 and the respective external connecting terminals 8, all of which are integrally formed, as shown in FIG. 1. In FIG. 1, the thin metal film 14 shown in FIG. 4 is omitted.

The conductive pattern 4 has a thickness of e.g. 5-20 μm, or preferably 7-15 μm, and the lines of wire 4a, 4b, 4c, and 4d have each a width of e.g. 5-500 μm, or preferably 10-200 μm. The interval between adjacent lines of wire 4a, 4b, 4c, and 4d is for example in the range of e.g. 5-500 μm, or preferably 10-200 μm.

Each external connecting terminal 8 has a width W1 of e.g. 100-1,100 μm, or preferably 140-540 μm, (a width of a portion thereof exposed from the insulating cover layer 10 with respect to a direction extending along the longitudinal direction of the supporting board 2) (Cf. FIG. 6). The interval W2 between adjacent external connecting terminals 8 (Cf. FIG. 6) is for example in the range of 50-1,500 μm, or preferably 200-800 μm.

Also, the each external connecting terminal 8 has an outer shape of a generally square form as viewed from top and has, at a center portion thereof, the first through hole 9 of a circular shape as viewed from top, as mentioned above. The first through holes 9 have a diameter D1 (Cf. FIG. 6) of e.g. 50-1,000 μm, or preferably 100-500 μm.

It is preferable that a nickel plating layer (not shown) is formed on the surface of the conductive pattern 4 by electroless nickel plating in a sequential process, to protect the conductive pattern 4.

Then, the insulating cover layer 10 is formed on the insulating base layer 3 to form a predetermined pattern that can allow the lines of wire 4a, 4b, 4c, 4d of the conductive pattern 4 to be covered and can allow the magnetic head connecting terminals 7 and the external connecting terminals 8 to be exposed, as shown in FIG. 2(d).

The same insulating material as that for the insulating base layer 3 is used for forming the insulating cover layer 10. Preferably, photosensitive polyimide resin is used for the insulating cover layer 10.

When the insulating cover layer 10 is formed in a predetermined pattern using e.g. the photosensitive polyimide resin, a solution of precursor of the photosensitive polyimide resin (photosensitive polyamic acid resin) is coated over the entire surface of the insulating base layer 3 including the conductive pattern 4 and the entire surface of the supporting board 2, as shown in FIG. 5(a), and then is heated at e.g. 60-150° C., or preferably at 80-120° C., to form a coating 16 of the precursor of the photosensitive polyimide resin.

Then, the coating 16 is exposed to light through a photo mask 17, as shown in FIG. 5(b). The photo mask 17 has a predetermined pattern comprising light shielding portions 17a and total-light-transmitting portions 17b.

The photo mask 17 is disposed opposite the coating 16 so that the light shielding portions 17a confront portions of the coating 16 where the insulating base layer 3 is not to be formed on the supporting board 2 and portions of the coating 16 corresponding to the magnetic head connecting terminals 7 and the external connecting terminals 8, and the total-light-transmitting portions 17b confront portions of the coating 16 where the insulating cover layer 10 is to be formed on the insulating base layer 3 including the lines of wire 4a, 4b, 4c, 4d. Then, the coating 16 is exposed to light in the same manner as the coating 11 is.

Figure 5:
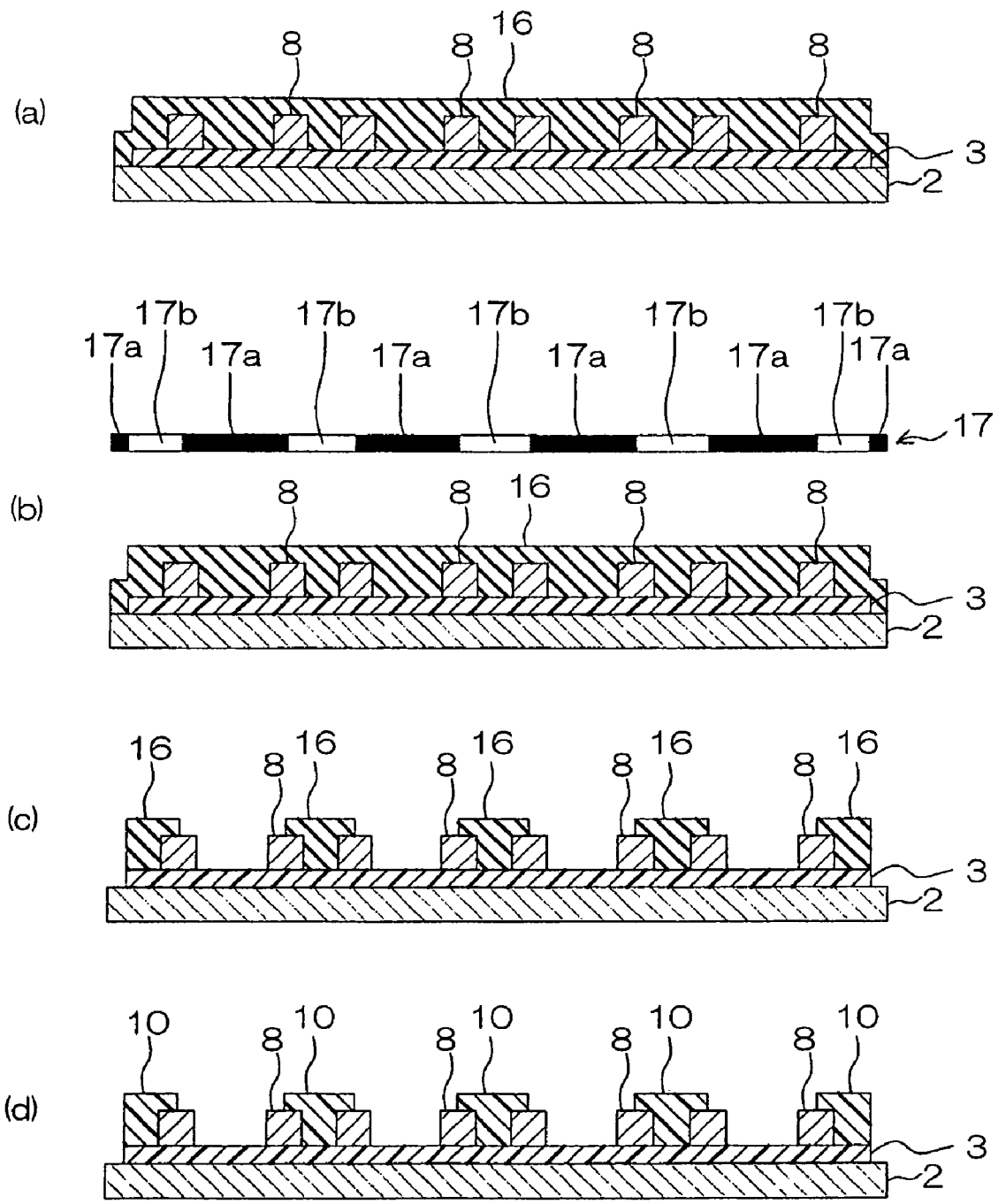
FIG. 5 is a detailed process drawing of the process of forming the insulating cover layer with a predetermined pattern on the insulating base layer shown in FIG. 2, (a) showing the process of forming a coating of precursor of photosensitive polyimide resin on the entire surface of the insulating base layer including the conductive pattern and of the supporting board, (b) showing the process of exposing the coating to light through a photo mask, (c) showing the process of developing the coating, and (d) showing the process of curing the coating to form the insulting cover layer of polyimide resin.

Then, the coating 16 thus exposed to light is developed in the same manner as the coating 11 is, as shown in FIG. 5(c). Illustrated in FIG. 5 is an embodiment using the process steps for forming the negative pattern.

In this developing process, the coating 16 is melted at portions thereof confronting the light shielding portions 17a of the photo mask 17 where the insulating base layer 3 is not formed on the supporting board 2 and corresponding to the respective magnetic head connecting terminals 7 and the respective external connecting terminals 8. As a result, the coating 16 is formed in such a predetermined pattern that the marginal portions of the supporting board 2, the magnetic head connecting terminals 7, and the external connecting terminals 8 are exposed.

Then, the coating 16 formed in the predetermined pattern is heated finally to e.g. 250° C. or more to be cured (imidized). As a result, the insulating cover layer 10 of polyimide resin is formed in the predetermined pattern wherein the respective lines of wire 4a, 4b, 4c, 4d are covered and also the respective magnetic head connecting terminals 7 and the respective magnetic head connecting terminals 8 are exposed, as shown in FIG. 5(d).

As an alternative to using the photosensitive synthetic resin, for example the synthetic resin may be coated to form said pattern, or a dry film previously processed to have said pattern may be adhesively bonded to the insulating base layer 3 through an adhesive layer, if necessary.

The insulating cover layer 10 has a thickness of e.g. 1-30 μm, or preferably 2-20 μm.

Thereafter, third through holes 20 corresponding to the first through holes 9 respectively (each having a common center axis with the first through hole 9) are formed in the supporting board 2 at portions thereof corresponding to the external connecting terminals 8, to extend through the supporting board 2 in the thickness direction thereof, as shown in FIG. 2(e). No particular limitation is imposed on the formation of the third through holes 20. For example, the third through holes 20 can be formed by the chemical etching, the drilling, the laser processing, and so on. Preferably, the chemical etching is used for forming them. The third through holes 20 have a diameter D3 of e.g. 150-1,200 μm, or preferably 180-600 μm (Cf. FIG. 6). As an alternative to forming the third through holes 20 to correspond to the first through holes 9, respectively, openings may be formed to include the first through holes 9.

Figure 2:
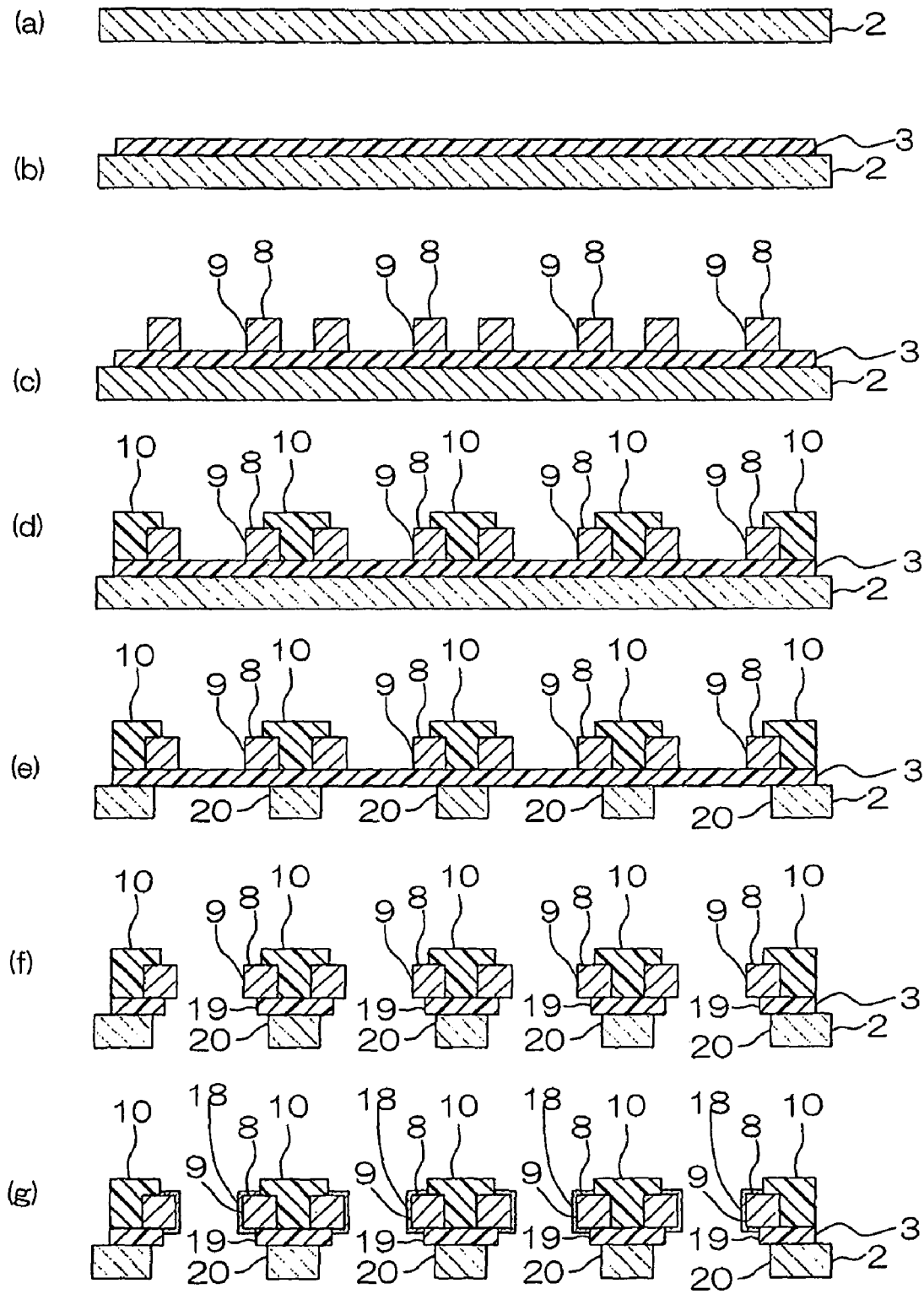
FIG. 2 is a process drawing showing an embodiment of a production method of the suspension board with circuit shown in FIG. 1, (a) showing the process of preparing a supporting board, (b) showing the process of forming an insulating base layer of a predetermined pattern on the supporting board, (c) showing the process of forming a conductive pattern on the insulating base layer, (d) showing the process of forming an insulating cover layer of a predetermined pattern on the insulating base layer, (e) showing the process of forming third through holes in the supporting board, (f) showing the process of forming second through holes in the insulating base layer, and (g) showing the process of forming a plating layer on each magnetic head connecting terminal and each external connecting terminal.

Further, second through holes 19 corresponding to the first through holes 9 respectively (each having a common center axis with the first through hole 9) are formed in the insulating base layer 3 at portions thereof exposed from the respective third through holes 20 and corresponding to the external connecting terminals 8, to extend through the insulating base layer 3 in the thickness direction thereof, as shown in FIG. 2(*f*). No particular limitation is imposed on the formation of the second through holes 19. For example, the second through holes 19 can be formed by the chemical etching, the drilling, the laser processing, and so on. Preferably, the chemical etching is used for forming them. The second through holes 19 have a diameter D2 of e.g. 100-1,100 μm, or preferably 140-540 μm (Cf. FIG. 6).

Thereafter, a plating layer 18 is formed on the magnetic head connecting terminals 7 and the external connecting terminals 8 to cover their surfaces so as to protect those surfaces, as shown in FIG. 2(*g*). No particular limitation is imposed on plating material used for forming the plating layer 18. For example, nickel and gold are used for the plating layer 18.

The plating layer 18 is formed using the electrolytic plating, or electroless plating, for example. The plating layer 18 may be formed in multilayer, using nickel plating and gold plating in a sequential order. In this plating layer 18, the nickel plating layer has a thickness of e.g. 0.5-5 μm and the gold plating layer has a thickness of e.g. 0.05-3 μm.

Then, the supporting board 2 is cut out into a gimbal 5 by a known process such as the chemical etching. After trimmed, it is rinsed and dried. The suspension board with circuit 1 shown in FIG. 1 is produced by the processes mentioned above. The trimming of the supporting board 2 may be performed before the plating layer 18 is formed.

In the suspension board with circuit 1 thus produced, the first through holes 9 are formed in the external connecting terminals 8; the second through holes 19 are formed in the insulating base layer 3, to communicate with and be larger than the first through holes 9; and the third through holes 20 are formed in the supporting board 2, to communicate with and be larger than the second through holes 19, as shown in FIG. 6.

This constitution can provide the result that when the solder balls 21 are placed on the external terminals 23 and then the suspension board with circuit 1 is placed from above to connect the external connecting terminals 8 to the external terminals 23 of the external circuit 22 via the solder balls 21, the solder balls 21 can be seen from above the suspension board with circuit 1 from the first through holes 9, the second through holes 19, and the third through holes 20.

This can provide the advantage that the connection between the external connecting terminals 8 and the external terminals 23 can be carried out while confirming whether the solder balls 21 are placed precisely from the first through holes 9, the second through holes 19, and the third through holes 20. This can ensure the reliable placement of the solder balls 21 on the external connecting terminals 8, for the connection between the external connecting terminals 8 and the external terminals 23 with a high degree of precision.

No particular limitation is imposed on the connection using the solder balls 21. For example, the solder balls 21 may be melted by reflow soldering with carriage or by the melting using laser thermo and the like.

Figure 7:
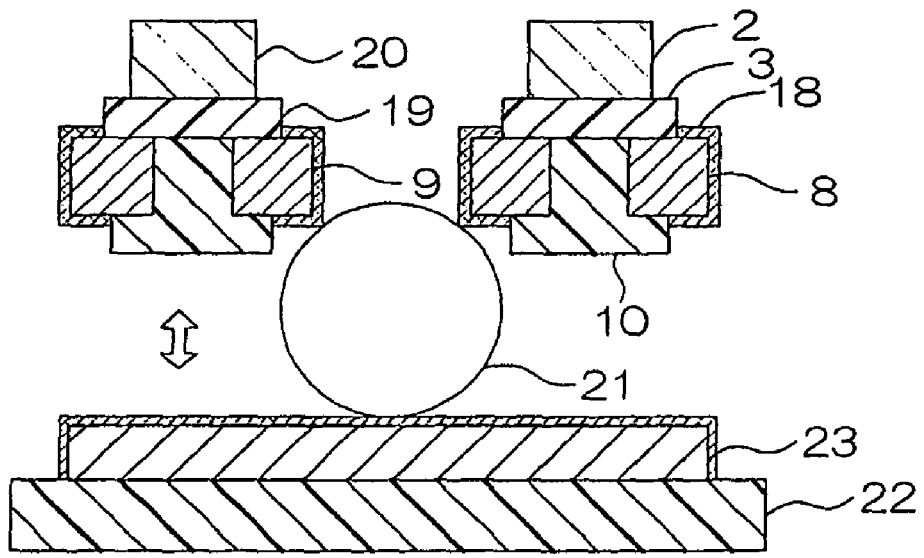
FIG. 7 is a sectional view of a principal part of another illustrative embodiment of the present invention, explaining the connection between an external connecting terminal of the suspension board with circuit shown in FIG. 1 and an external terminal of an external circuit (a variant of FIG. 6 wherein the suspension board with circuit is turned upside down)

In the connection method shown in FIG. 6, the solder balls 21 are placed on the external terminals 23 and then the suspension board with circuit 1 is placed in the state in which the supporting board 2 is located below and the insulating cover layer 10 is located above, to sandwich the solder balls 21 between the external connecting terminals 8 and the external terminals 23. An alternative connection method shown in FIG. 7 for example may be adopted wherein the solder balls 21 are placed on the external terminals 23 and then the suspension board with circuit 1 is placed in the state in which the insulating cover layer 10 is located below and the supporting board 2 is located above, to sandwich the solder balls 21 between the external connecting terminals 8 and the external terminals 23.

Figure 8:
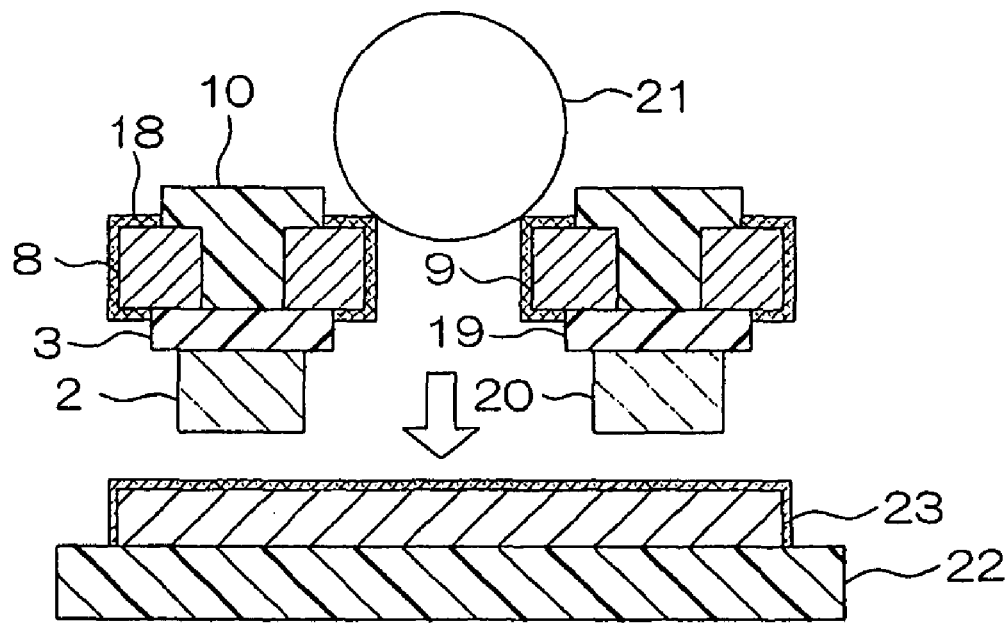
FIG. 8 is a sectional view of a principal part of the illustrative embodiment of the present invention, explaining the connection between the external connecting terminal of the suspension board with circuit shown in FIG. 1 and the external terminal of the external circuit (an illustrative aspect of the solder ball to be dropped down)

Further, since this suspension board with circuit 1 has the first through holes 9, the second through holes 19, and the third through holes 20 which are formed at the respective external connecting terminals 8 to extend through the suspension board with circuit 1 in the thickness direction, another alternative connection method shown in FIG. 8 may be adopted wherein the external connecting terminals 8 are disposed opposite the external terminals 23 in the state in which the supporting board 2 is located below and the insulating cover layer 10 is located above, and then the solder balls 21 are melted and dropped from above the external connecting terminals 8, whereby the external connecting terminals 8 and the external terminals 23 are connected with each other via the solder balls 21.

In these alternatives as well, the connection between the external connecting terminals 8 and the external terminals 23 can be carried out while confirming whether the external terminals 23 are precisely placed from the first through holes 9, the second through holes 19, and the third through holes 20. This can ensure the reliable placement of the solder balls 21 on the external connecting terminals 8, for the connection between the external connecting terminals 8 and the external terminals 23 with a high degree of precision.

Figure 9:
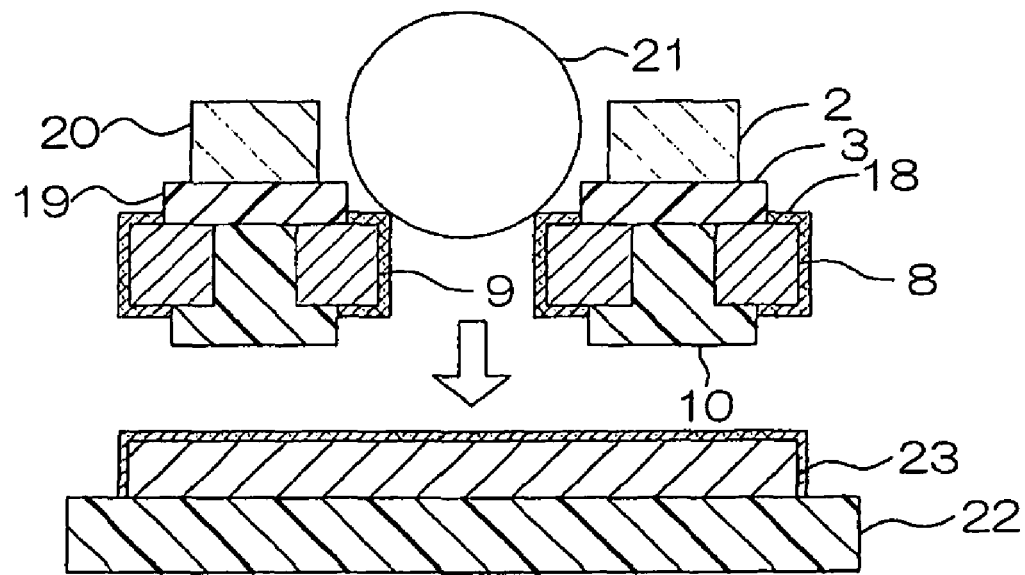
FIG. 9 is a sectional view of a principal part of another illustrative embodiment of the present invention, explaining the connection between an external connecting terminal of the suspension board with circuit shown in FIG. 1 and an external terminal of an external circuit (a variant of FIG. 8 wherein the suspension board with circuit is turned upside down)

A further alternative connection method shown in FIG. 9 may be adopted wherein the external connecting terminals 8 are disposed opposite the external terminals 23 in the state in which the insulating cover layer 10 is located below and the supporting board 2 is located above, and then the solder balls 21 are melted and dropped from above the external connecting terminals 8.

As an alternative to the producing method described above, the producing method shown in FIGS. 10-13 may be adopted wherein the insulating base layer 3 is formed to have reduced thickness at portions thereof where the second through holes 19 are to be formed. This method can provide improved producing efficiency. In FIGS. 10-13, terminal placing portions 6 of the supporting board 2 are shown in section taken along the longitudinal direction of the supporting board 2.

Figure 10:
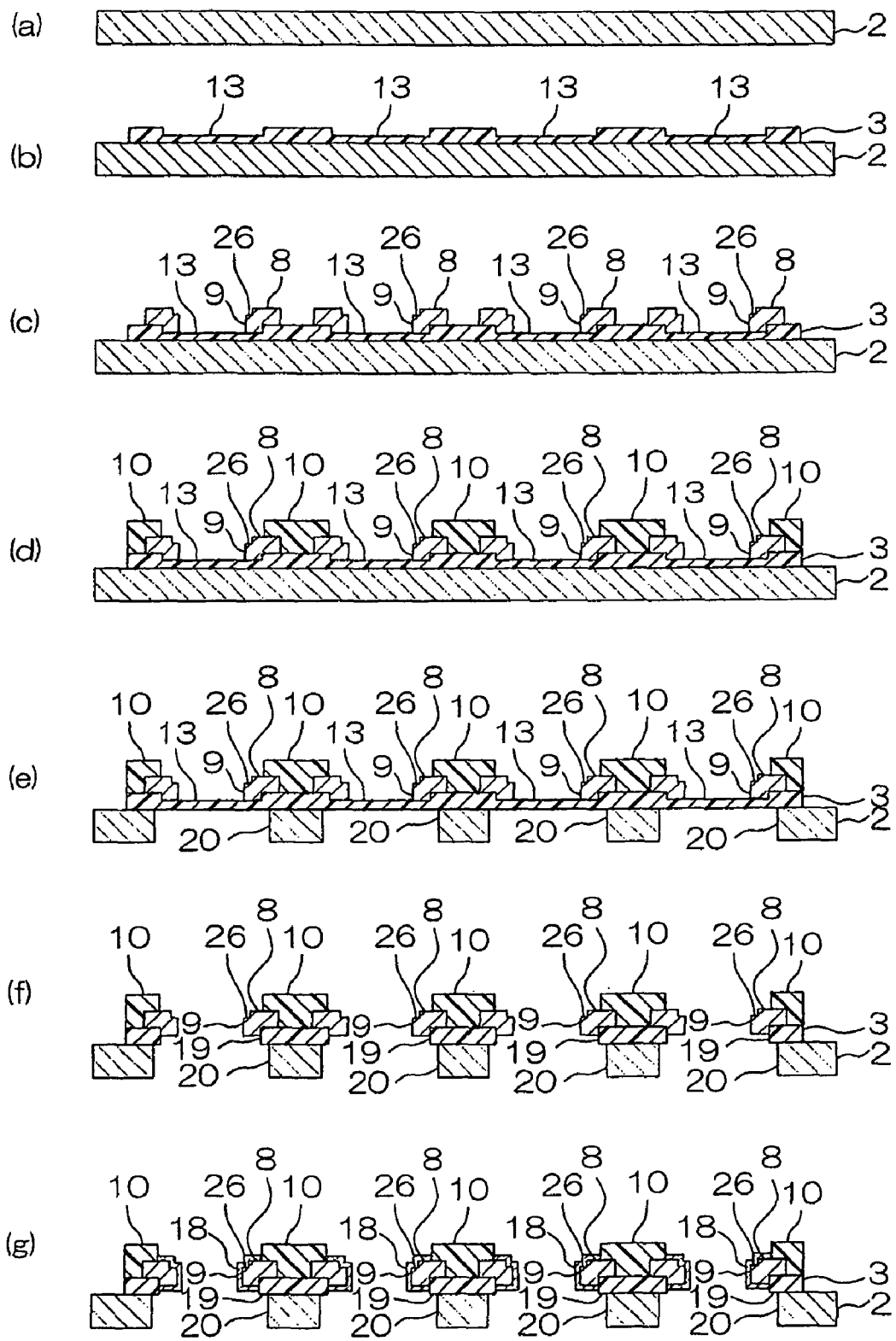
FIG. 10 is a process drawing showing another embodiment of a production method of the suspension board with circuit shown in FIG. 1, (a) showing the process of preparing a supporting board, (b) showing the process of forming an insulating base layer of a predetermined pattern with recesses on the supporting board, (c) showing the process of forming a conductive pattern on the insulating base layer, (d) showing the process of forming an insulating cover layer of a predetermined pattern on the insulating base layer, (e) showing the process of forming third through holes in the supporting board, (f) showing the process of forming second through holes in the insulating base layer, and (g) showing the process of forming a plating layer on each magnetic head connecting terminal and each external connecting terminal.

In this method, after the supporting board 2 is prepared, first, as shown in FIG. 10(*a*), the insulating base layer 3 is formed on the supporting board 2 in a predetermined pattern wherein concave portions 13 are formed in the insulating base layer 3 at portions thereof corresponding to portions of the external connecting terminals 8 where the second through holes 19 are to be formed, as shown in FIG. 10(*b*).

Figure 11:
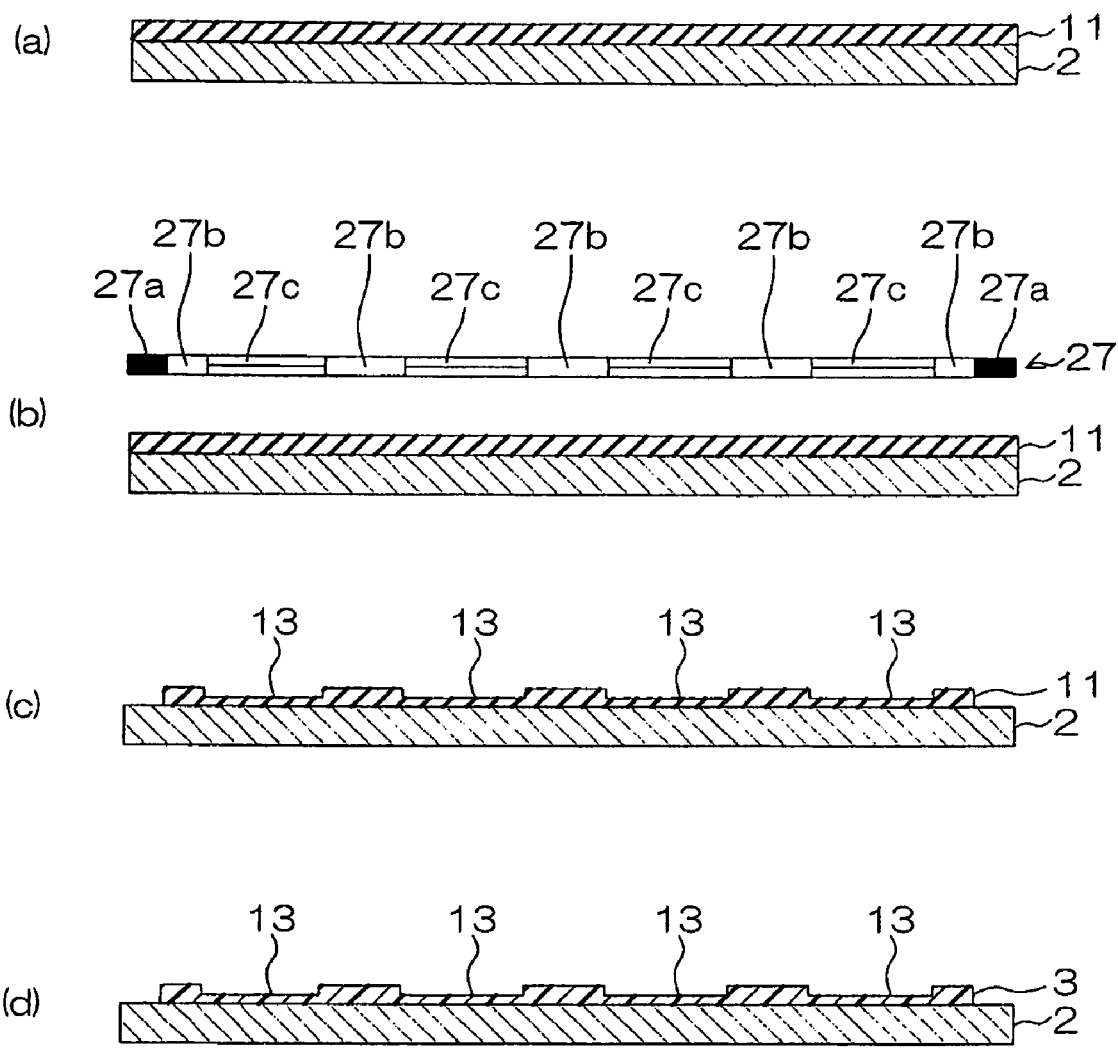
FIG. 11 is a detailed process drawing of the process of forming the insulating base layer on the supporting board shown in FIG. 10, (a) showing the process of forming a coating of precursor of photosensitive polyimide resin on the entire surface of the supporting board, (b) showing the process of exposing the coating to light through a photo mask, (c) showing the process of developing the coating, and (d) showing the process of curing the coating to form the insulting base layer with the recesses of polyimide resin.

Then, for example when photosensitive polyimide resin is used to form the insulating base layer 3 in the predetermined pattern on the supporting board 2, the coating 11 is formed from the solution of precursor of the photosensitive polyimide resin (photosensitive polyamic acid resin) in the same manner as above, as shown in FIG. 11(*a*). Then, the coating 11 is exposed to light through a photo mask 27, as shown in FIG. 11(*b*). The photo mask 27 has a predetermined pattern comprising light shielding portions 27*a*, total-light-transmitting portions 27*b*, and semi-light-transmitting portions 27*c*. The semi-light-transmitting portions 27*c* permit light to transmit in a light transmission ratio selected from the range falling within 10-90%, or preferably 30-60%, of the total transmission of 100%.

The photo mask 27 is disposed opposite the coating 11 so that that the light shielding portions 27*a* confront portions of the coating 11 where the insulating base layer 3 is not to be formed on the supporting board 2; the total-light-transmitting portions 27*b* confront portions of the coating 11 where the insulating base layer 3 is to be formed on the supporting board 2; and the semi-light-transmitting portions 27c confront portions of the coating 11 where the concave portions 13 are to be formed. Then, the coating 11 is exposed to light in the same manner as above.

Then, the coating 11 thus exposed to light is developed in the same manner as above, as shown in FIG. 11(c). In this developing process, the coating 11 is melted at marginal portions thereof confronting the light shielding portions 27a of the photo mask 27, so that the marginal portions of the supporting board 2 are exposed. Also, it is partly melted at the portions thereof confronting the semi-light-transmitting portions 27c of the photo mask 27 where the concave portions 13 are to be formed. Accordingly, the coating 11 is formed in such a predetermined pattern that the portions confronting the semi-light-transmitting portions 27c have a thickness smaller than the portions confronting the total-light-transmitting portions 27b.

Then, the coating 11 formed in the predetermined pattern is heated finally to e.g. 250° C. or more to be cured (imidized). As a result, the insulating base layer 3 of polyimide resin is formed in a predetermined pattern wherein the marginal portions of the supporting board 2 are exposed and also the concave portions 13 are formed in the insulating base layer 3 at portions thereof where the second through holes 19 of the external connecting terminals 8 are to be formed, to have a thickness smaller than the remaining portions, as shown in FIG. 11(d). To be more specific, the concave portions 13 are formed in generally circular form as viewed from top, having a thickness equal to 10-50% of that of the remaining portion of the insulating base layer 3.

Then, the conductive pattern 4 is formed in the same manner as above, as shown in FIG. 2(c). For example, in the additive process, a thin film 14 is formed as a seed film on a surface of the supporting board 2 exposed from the insulating base layer 3 and the entire surface of the insulating base layer 3, as shown in FIG. 12(a). Then, the plating resist 15 having a reverse pattern to the conductive pattern 4 is formed on the surface of the thin metal film 14, as shown in FIG. 12(b). Then, the conductive pattern 4 is formed on the surface of the thin metal film 14 exposed form the plating resist 15 in the same manner as above, as shown in FIG. 12(c). Thereafter, the plating resist 15 is removed, as shown in FIG. 12(d). Then, the thin metal film 14 exposed from the conductive pattern 4 is removed, as shown in FIG. 12(e).

Figure 12:
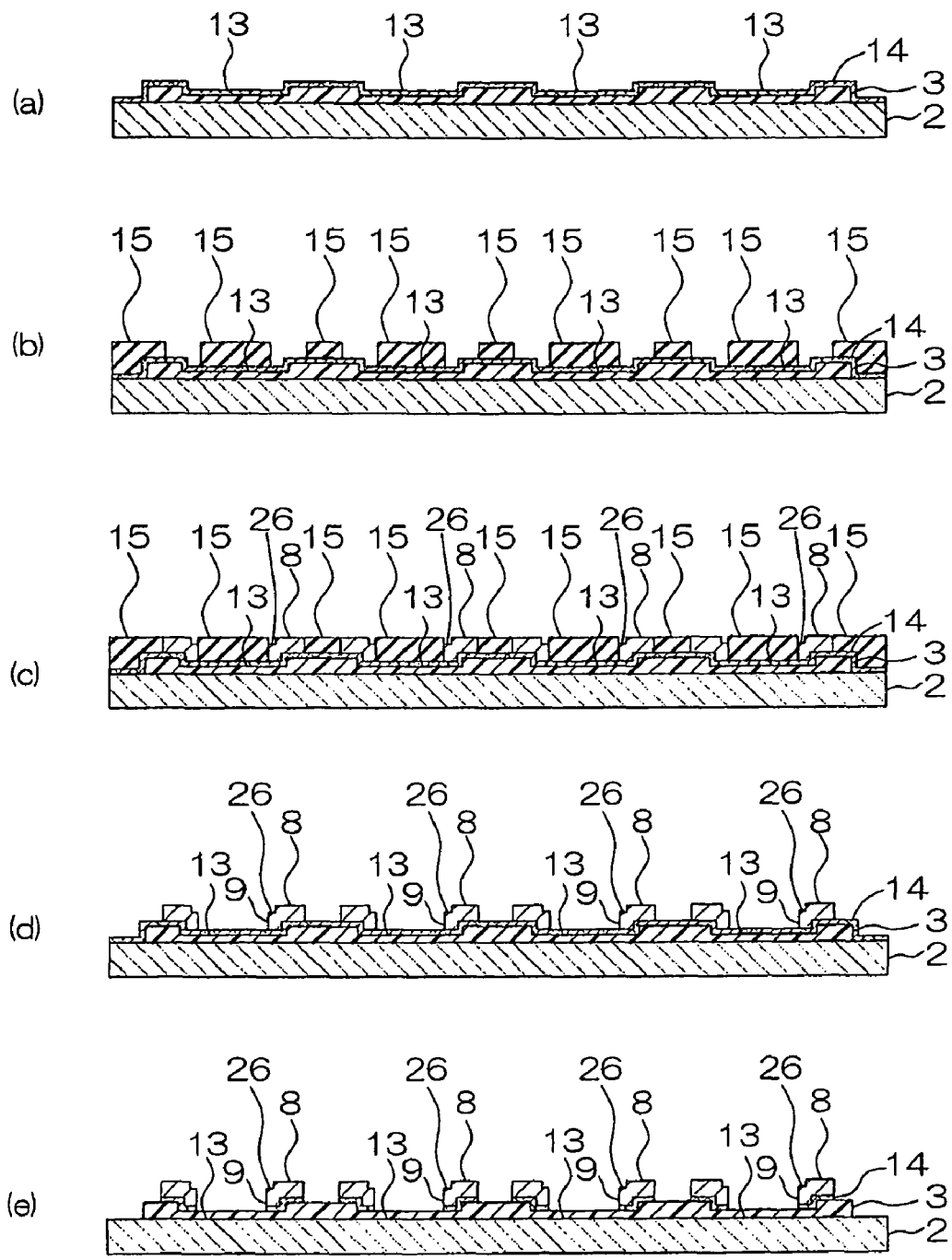
FIG. 12 is a detailed process drawing of the process of forming the conductive pattern on the insulating base layer shown in FIG. 10, (a) showing the process of forming a thin metal film on a surface of the supporting board exposed from the insulating base layer and on the entire surface of the insulating base layer, (b) showing the process of forming on a surface of the thin metal film a plating resist of a reverse pattern to the conductive pattern, (c) showing the process of forming the conductive pattern on the surface of the thin metal film exposed from the plating resist, (d) showing the process of removing the plating resist, and (e) showing the process of removing the thin metal film exposed from the conductive pattern.
Figure 13:
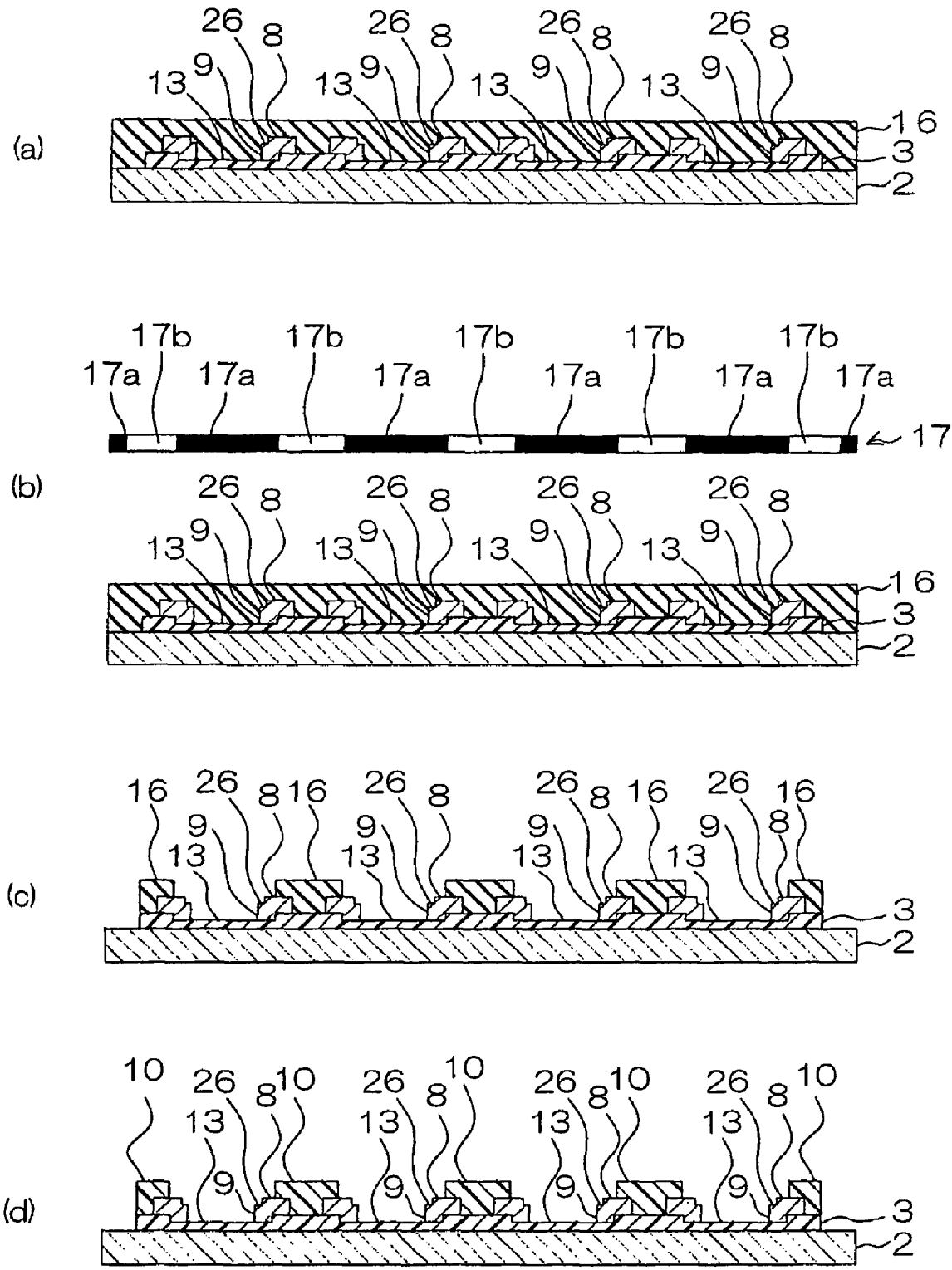
FIG. 13 is a detailed process drawing of the process of forming the insulating cover layer of a predetermined pattern on the insulating base layer shown in FIG. 10, (a) showing the process of forming a coating of precursor of photosensitive polyimide resin on the entire surface of the insulating base layer including the conductive pattern and of the supporting board, (b) showing the process of exposing the coating to light through a photo mask, (c) showing the process of developing the coating, and (d) showing the process of curing the coating to form the insulting cover layer of polyimide resin.

After the processes mentioned above, the conductive pattern 4 including the lines of wire 4a, 4b, 4c, and 4d, the respective magnetic head connecting terminals 7 and the respective external connecting terminals 8, all of which are integrally formed, as shown in FIG. 1. In FIG. 1, the thin metal film 14 shown in FIG. 12 is omitted.

The external connecting terminals 8 have annular shoulder portions 26 at opening portions of the first through holes 9 corresponding to the concave portions 13 of the insulating base layer 3, Then, the insulating cover layer 10 is formed on the insulating base layer 3 to form a predetermined pattern that can allow the lines of wire 4a, 4b, 4c, 4d of the conductive pattern 4 to be covered and can allow the magnetic head connecting terminals 7 and the external connecting terminals 8 to be exposed, as shown in FIG. 10(d). The same insulating material as above is used for the insulating cover layer 10.

For example, when the insulating cover layer 10 is formed on the insulating base layer 3 to have a predetermined pattern by using e.g. the photosensitive polyimide resin, the coating 16 is formed from the solution of precursor of the photosensitive polyimide resin (photosensitive polyamic acid resin) in the same manner as above, as shown in FIG. 13(a). Then, the coating 16 is exposed to light through the photo mask 17, as shown in FIG. 13(b). Then, the coating 16 thus exposed to light is developed in the same manner as the coating 11 is, as shown in FIG. 13(c). Then, the coating 16 formed in the predetermined pattern is cured (imidized) in the same manner as above, as shown in FIG. 13(d). As a result, the insulating cover layer 10 of polyimide resin is formed in a predetermined pattern wherein the respective lines of wire 4a, 4b, 4c, 4d are covered and also the respective magnetic head connecting terminals 7 and the respective external connecting terminals 8 are exposed.

Thereafter, the third through holes 20 are formed in the supporting board 2 at portions thereof corresponding to the external connecting terminals 8 in the same manner as above, as shown in FIG. 10(e). Then, the concave portions 13 corresponding to the external connecting terminals 8 are removed from the insulating base layer 3 exposed from the third through holes 20, to form second through holes 19, as shown in FIG. 10(f). In the formation of the second through holes 19, since the concave portions 13 are thinner in thickness than the remaining portions of the insulating base layer 3, the time required for the removal (e.g. etching time) can be shortened to that extent. Hence, the suspension board with circuit 1 can be produced with efficiency.

Figure 14:
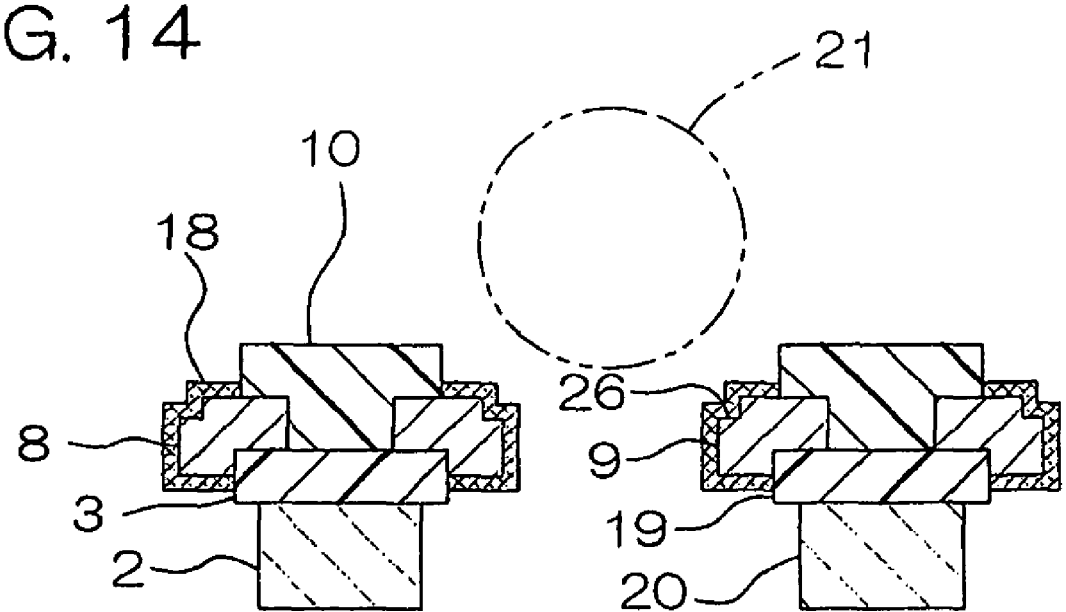
FIG. 14 is a sectional view of a principal part of the external connecting terminal of the suspension board with circuit shown in FIG. 1.
Figure 15:
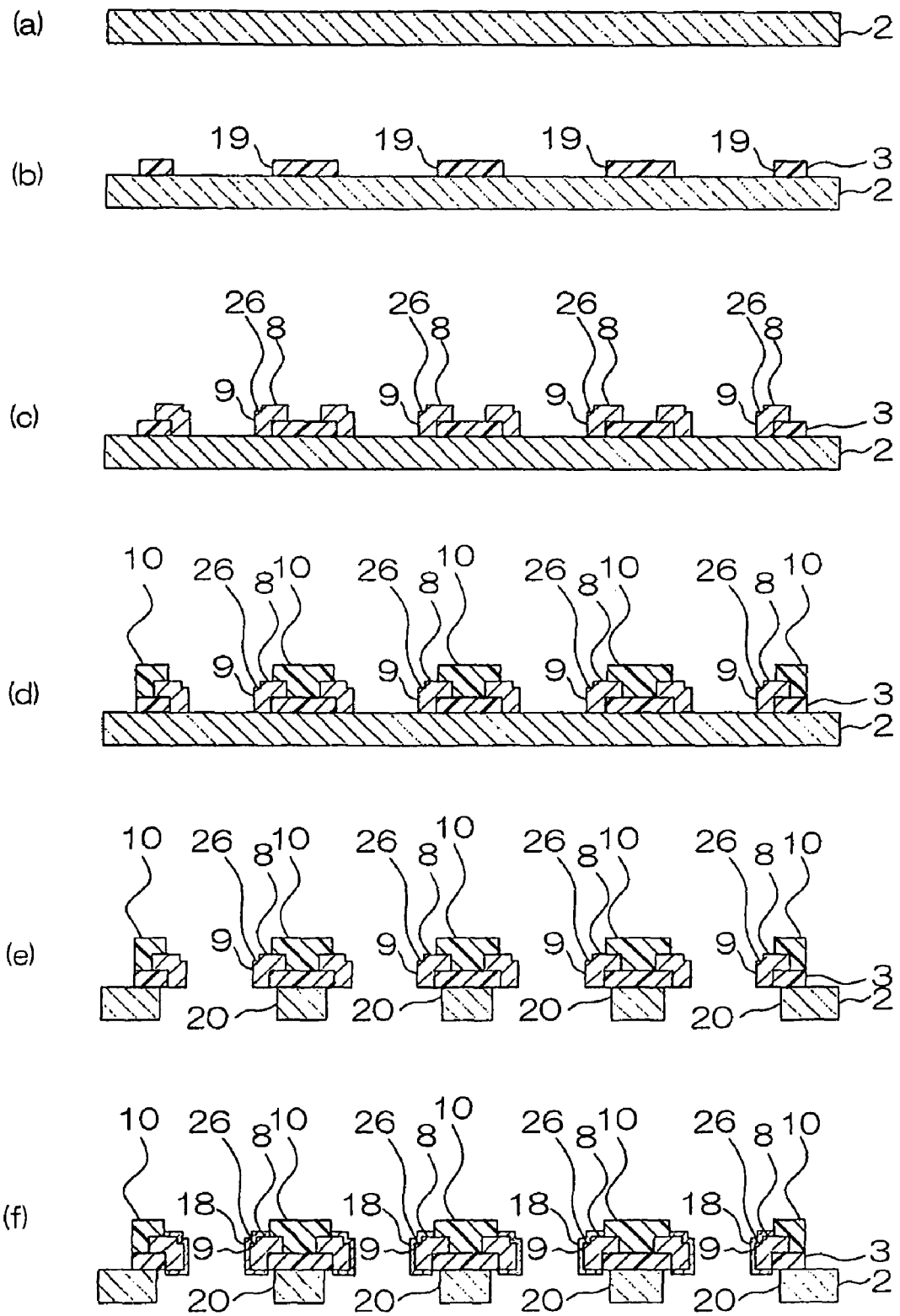
FIG. 15 is a process drawing showing yet another embodiment of a production method of the suspension board with circuit shown in FIG. 1, (a) showing the process of preparing a supporting board, (b) showing the process of forming an insulating base layer of a predetermined pattern with second through holes on the supporting board, (c) showing the process of forming a conductive pattern on the insulating base layer and the supporting board, (d) showing the process of forming an insulating cover layer of a predetermined pattern on the insulating base layer, (e) showing the process of forming third through holes in the supporting board, and (f) showing the process of forming a plating layer on each magnetic head connecting terminal and each external connecting terminal.
Figure 16:
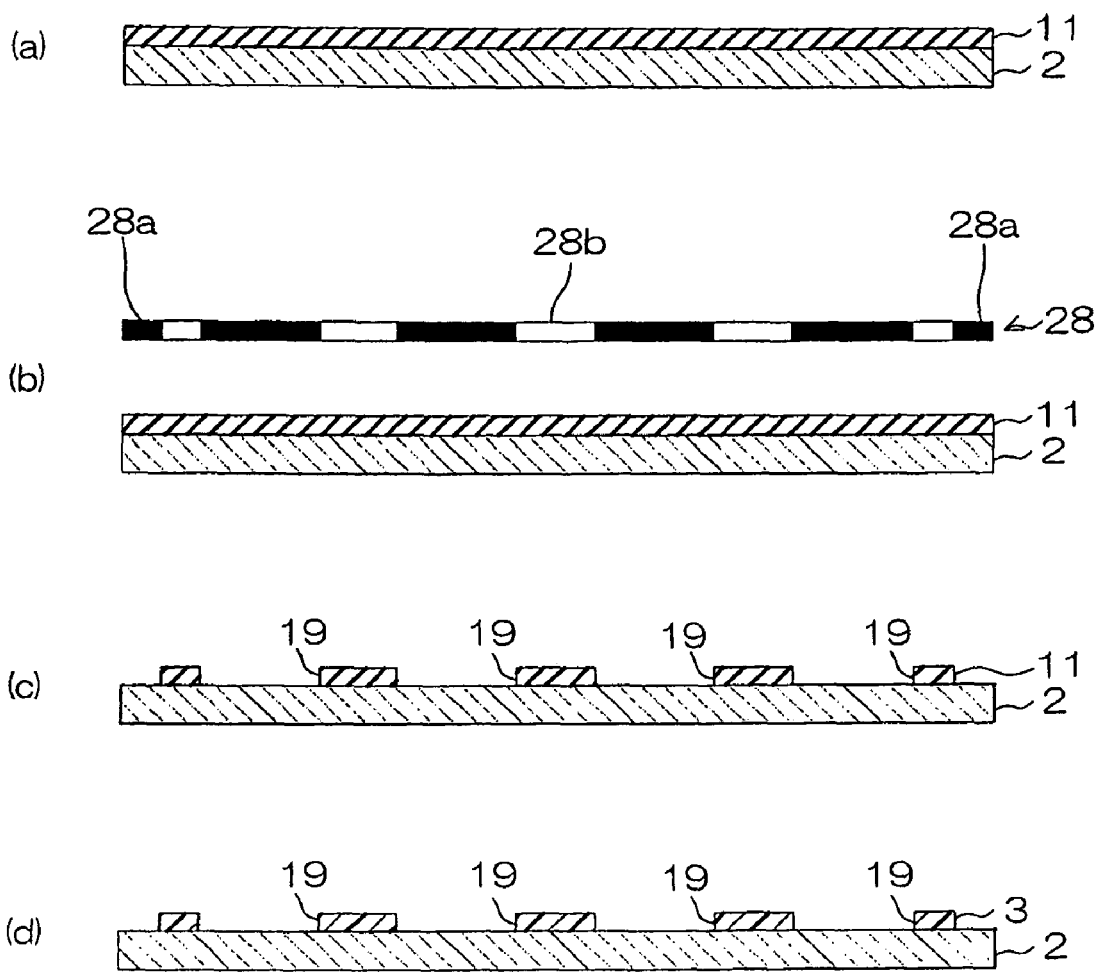
FIG. 16 is a detailed process drawing of the process of forming the insulating base layer on the supporting board shown in FIG. 15, (a) showing the process of forming a coating of precursor of photosensitive polyimide resin on the entire surface of the supporting board, (b) showing the process of exposing the coating to light through a photo mask, (c) showing the process of developing the coating, and (d) showing the process of curing the coating to form the insulting base layer with the second through holes.

Thereafter, the plating layer 18 is formed on the magnetic head connecting terminals 7 and the external connecting terminals 8 to cover their surfaces so as to protect those surfaces in the same manner as above, as shown in FIG. 10(g). Then, the supporting board 2 is cut out into a shape of the gimbal 5 by a known process such as the chemical etching. After trimmed, it is rinsed and dried. The suspension board with circuit 1 shown in FIG. 1 is produced by the processes mentioned above. A sectional view of the principal part of the external connecting terminals 8 is shown in FIG. 14.

As an alternative to the producing method described above, the producing method shown in FIGS. 15-18 may be adopted wherein the conductive pattern 4 is formed on the stainless supporting board 2. This can provide the result of eliminating the need to etch the insulating base layer 3 and thus curtailing the producing processes. In FIGS. 15-18, terminal arranging portions 6 of the supporting board 2 are shown in section taken along the longitudinal direction of the supporting board 2.

In this method, after the supporting board 2 is prepared, first, as shown in FIG. 15(a), the insulating base layer 3 is formed on the supporting board 2 in a predetermined pattern wherein the second through holes 19 are formed in the insulating base layer 3, as shown in FIG. 15(b).

The same as those mentioned above is used as the supporting board 2 and the insulating base layer 3.

For example when photosensitive polyimide resin is used to form the insulating base layer 3 in the predetermined pattern on the supporting board 2, the coating 11 is formed from the solution of precursor of the photosensitive polyimide resin (photosensitive polyamic acid resin) in the same manner as above, first, as shown in FIG. 16(a). Then, the coating 11 is exposed to light through a photo mask 28, as shown in FIG. 16(b). The photo mask 28 has a pattern comprising light shielding portions 28a, and total-light-transmitting portions 28b. The photo mask 28 is disposed opposite the coating 11 so that the light shielding portions 28a confront portions of the coating 11 where the insulating base layer 3 is not to be formed on the supporting board 2 (the marginal portion of the supporting board 2 and the second-through-hole-19-forming portions of the external connecting terminals 8) and the totallight-transmitting portions 28b confront portions of the coating 11 where the insulating base layer 3 is to be formed on the supporting board 2.

Then, the coating 11 thus exposed to light is developed in the same manner as above, as shown in FIG. 16(c). In this developing process, the coating 11 is melted at its marginal portions and at its second-through-hole-19-forming portions in the external connecting terminals 8, both confronting the light shielding portions 28a of the photo mask 28, to form such a predetermined pattern that the marginal portions of the supporting board 2 and the second through holes 19 of the supporting board 2 are exposed.

Then, the coating 11 formed in the predetermined pattern is heated finally to e.g. 250° C. or more to be cured (imidized). As a result, the insulating base layer 3 of polyimide resin is formed in a predetermined pattern wherein the marginal portions of the supporting board 2 are exposed and also the second through holes 19 of the supporting board 2 are exposed, as shown in FIG. 16(d).

Then, the conductive pattern 4 is formed in the same manner as above, as shown in FIG. 15(c). For example, in the additive process, the thin film 14 is formed as the seed film on the surface of the supporting board 2 exposed from the insulating base layer 3 and the entire surface of the insulating base layer 3, as shown in FIG. 17(a). Then, the plating resist 15 having a reverse pattern to the conductive pattern 4 is formed on the surface of the thin metal film 14, as shown in FIG. 17(b). Then, the conductive pattern 4 is formed on the surface of the thin metal film 14 exposed from the plating resist 15 in the same manner as above, as shown in FIG. 17(c). Thereafter, the plating resist 15 is removed, as shown in FIG. 17(d). Then, the thin metal film 14 exposed from the conductive pattern 4 is removed, as shown in FIG. 17(e).

Figure 17:
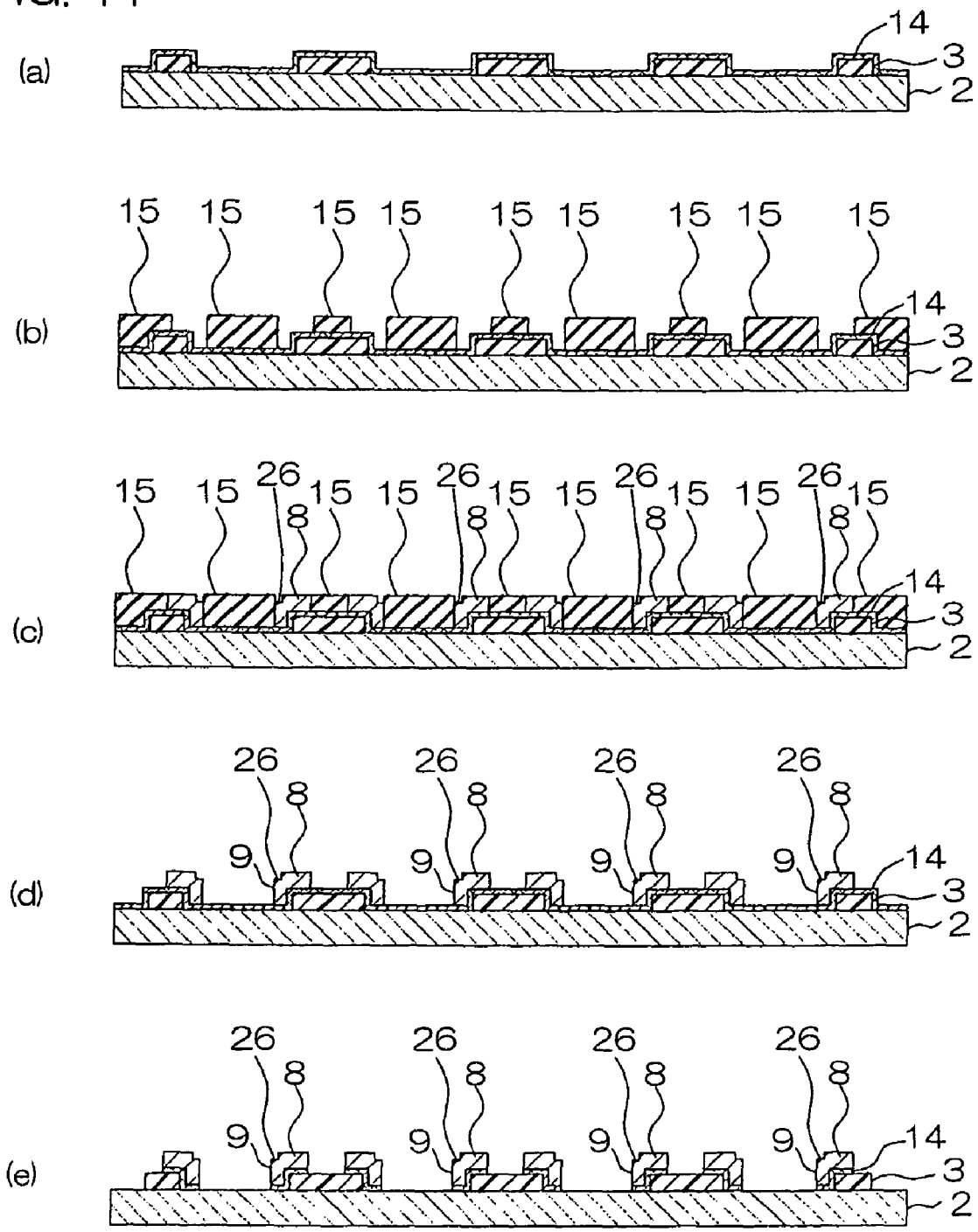
FIG. 17 is a detailed process drawing of the process of forming the conductive pattern on the insulating base layer shown in FIG. 15, (a) showing the process of forming a thin metal film on a surface of the supporting board exposed from the insulating base layer and on the entire surface of the insulating base layer, (b) showing the process of forming on a surface of the thin metal film a plating resist of a reverse pattern to the conductive pattern, (c) showing the process of forming the conductive pattern on the surface of the thin metal film exposed from the plating resist, (d) showing the process of removing the plating resist, and (e) showing the process of removing the thin metal film exposed from the conductive pattern.
Figure 18:
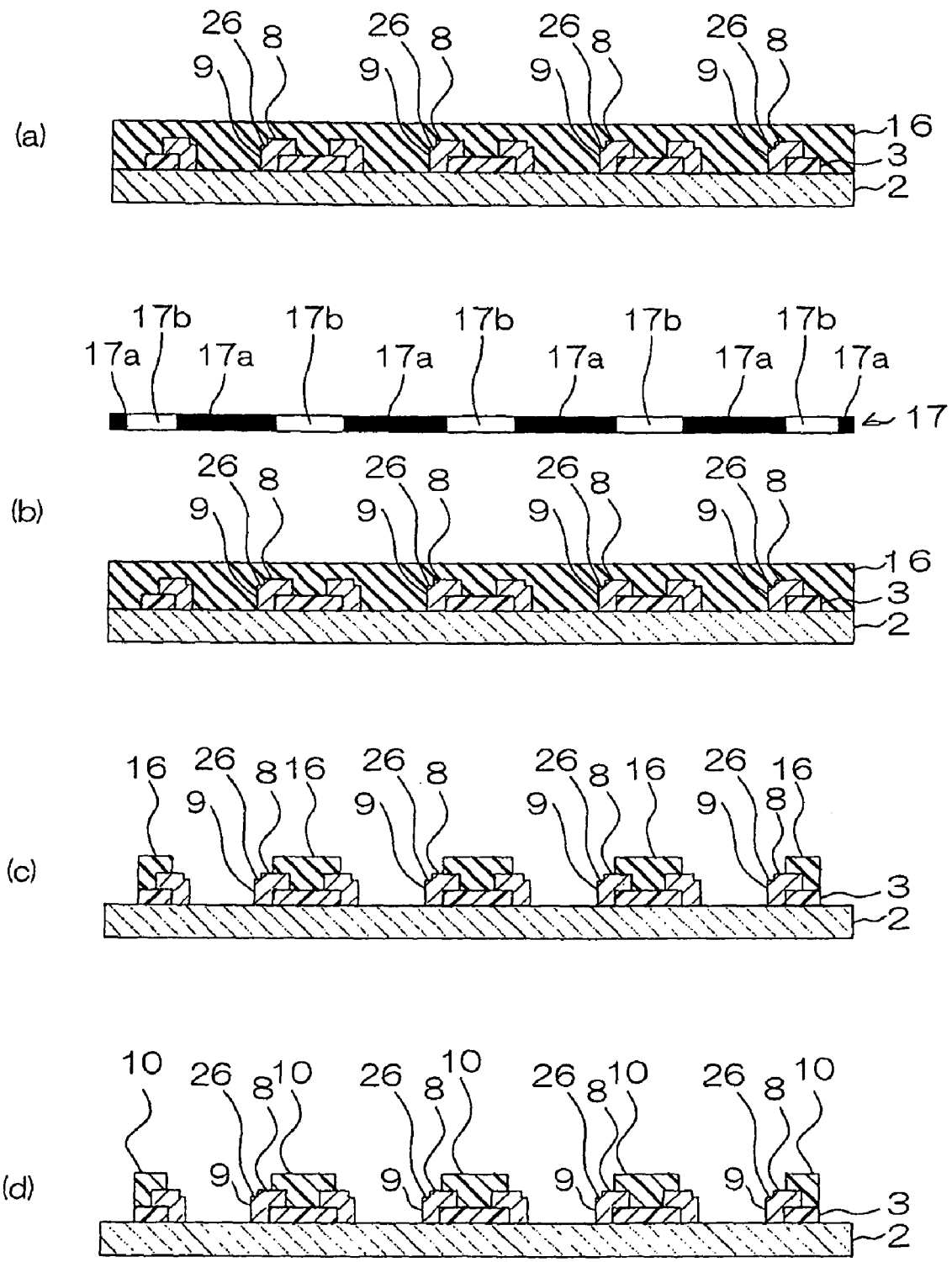
FIG. 18 is a detailed process drawing of the process of forming the insulating cover layer of a predetermined pattern on the insulating base layer shown in FIG. 15, (a) showing the process of forming a coating of precursor of photosensitive polyimide resin on the entire surface of the insulating base layer including the conductive pattern and of the supporting board, (b) showing the process of exposing the coating to light through a photo mask, (c) showing the process of developing the coating, and (d) showing the process of curing the coating to form the insulting cover layer of polyimide resin.

After the processes mentioned above, the conductive pattern 4 including the lines of wire 4a, 4b, 4c, and 4d, the respective magnetic head connecting terminals 7 and the respective external connecting terminals 8, all of which are integrally formed, as shown in FIG. 1. In FIG. 1, the thin metal film 14 shown in FIG. 17 is omitted.

The external connecting terminals 8 have annular shoulder portions 26 formed at opening portions of the first through holes 9 corresponding to portions thereof where the insulating base layer 3 is not formed.

Then, the insulating cover layer 10 is formed on the insulating base layer 3 to form a predetermined pattern that can allow the lines of wire 4a, 4b, 4c, 4d of the conductive pattern 4 to be covered and can allow the magnetic head connecting terminals 7 and the external connecting terminals 8 to be exposed, as shown in FIG. 15(d). The same insulating material as above is used for the insulating cover layer 10.

For example, when the insulating cover layer 10 is formed on the insulating base layer 3 to have a predetermined pattern by using the photosensitive polyimide resin, the coating 16 is formed from the solution of precursor of the photosensitive polyimide resin (photosensitive polyamic acid resin) in the same manner as above, as shown in FIG. 18(a). Then, the coating 16 is exposed to light through the photo mask 17, as shown in FIG. 18(b). Then, the coating 16 thus exposed to light is developed in the same manner as the coating 11 is, as shown in FIG. 18(c). Then, the coating 16 formed in the predetermined pattern is cured (imidized) in the same manner as above, as shown in FIG. 18(d). As a result, the insulating cover layer 10 of polyimide resin is formed in a predetermined pattern wherein the respective lines of wire 4a, 4b, 4c, 4d are covered and also the respective magnetic head connecting terminals 7 and the respective external connecting terminals 8 are exposed.

Thereafter, the third through holes 20 are formed in the supporting board 2 at portions thereof corresponding to the external connecting terminals 8 in the same manner as above, as shown in FIG. 15(e).

Figure 19:
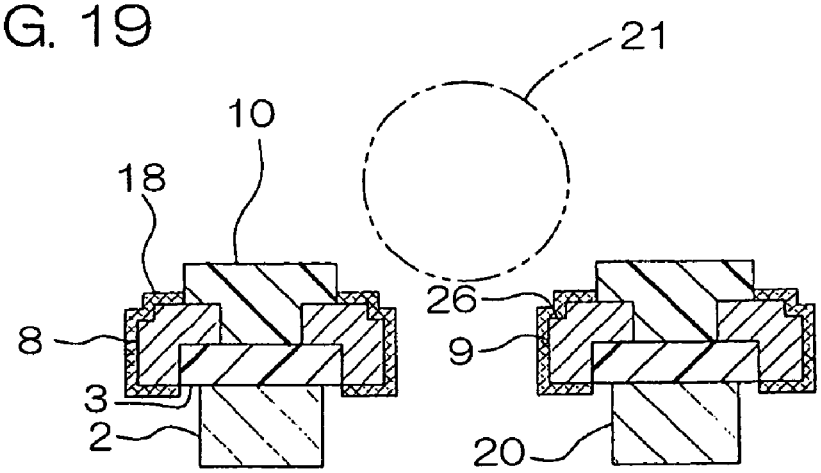
FIG. 19 is a sectional view of a principal part of the external connecting terminal of the suspension board with circuit shown in FIG. 1.

Then, after the plating layer 18 is formed on the magnetic head connecting terminals 7 and the external connecting terminals 8 to cover their surfaces so as to protect those surfaces in the same manner as above, as shown in FIG. 15(f). Thereafter, the supporting board 2 is cut out into a shape of the gimbal 5 by a known process such as the chemical etching. After trimmed, it is rinsed and dried. The suspension board with circuit 1 shown in FIG. 1 is produced by the processes mentioned above. A sectional view of the principal part of the external connecting terminals 8 is shown in FIG. 19.

Although the illustrative embodiment wherein the external connecting terminals 8 are formed in generally square form as viewed from top and the first through holes 9, the second through holes 19, and the third through holes 20 are formed in generally circular form as viewed from top has been illustrated above, the shape of the external connecting terminals 8 and the shape of the first, second, and third through holes 9, 19, 20 may be properly selected for intended purposes and applications, without any particular limitation being imposed thereon. For example, the first through holes 9, the second through holes 19, and the third through holes 20 may be formed in generally rectangular form as viewed from top. In this variant, one side of the first rectangular through holes 9, one side of the second rectangular through hole 19, and one side of the third rectangular through hole 20 are set to be equal to diameters of the first through holes 9, second through holes 19, and third through holes 20, respectively.

Although the suspension board with circuit 1 is presented as an example of the wired circuit board of the present invention, the wired circuit board of the present invention includes a single sided flexible wired circuit board, a double sided flexible wired circuit board, and a multilayer flexible wired circuit board.

Figure 20:
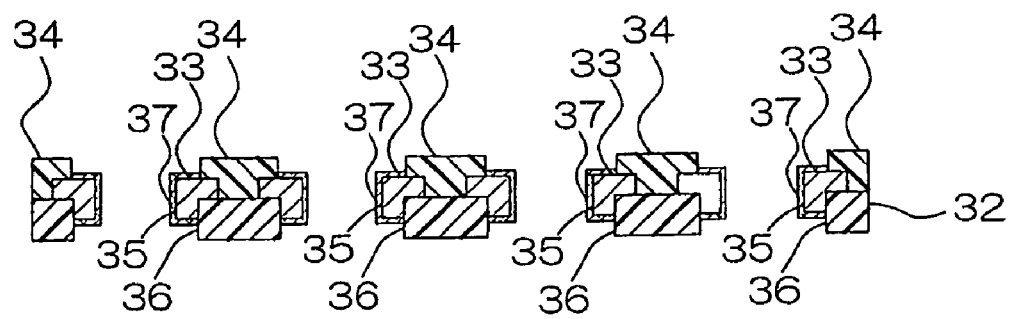
FIG. 20 is a sectional view showing a single-sided flexible wired circuit board which is in the form of one embodiment of the wired circuit board of the present invention.

For example, such a single sided flexible wired circuit board 31 is shown in FIG. 20 for illustrative purposes.

The single sided flexible wired circuit board 31 shown in FIG. 20 comprises the insulating base layer 32, a number of terminals 33 formed on the insulating base layer 32 to be integral with the conductive pattern, and the insulating cover layer 34 formed on the insulating base layer 32 in such a manner that the conductive pattern is covered and the respective terminals 33 are exposed In this single sided flexible wired circuit board 31, the first through holes 35 are formed in the terminals 33 to extend therethrough in the thickness direction, and the second through holes 36 are formed in the insulating base layer 32 to extend therethrough in the thickness direction so as to communicate with the first through holes 35. Also, the plating layers 37 are formed on the terminals 33.

The suspension board with circuit 1 illustrated above can be industrially produced by a known process such as, for example, a roll-to-roll process.

EXAMPLE

While in the following, the present invention will be described in further detail with reference to Examples, the present invention is not limited thereto.

Example 1

The supporting board 2 of a stainless foil (SUS304) of 300 mm wide and 25 µm thick was prepared (Cf. FIG. 2(a)).

Then, after solution of precursor of photosensitive polyimide resin (photosensitive polyamic acid resin) was coated over the entire surface of the supporting board 2, the coated resin was heated for two minutes at 120° C., to form a coating 11 of the precursor of the photosensitive polyimide resin (Cf. FIG. 3(a)).

Thereafter, the photo mask 12 was disposed opposite the coating 11 so that the light shielding portions 12a confronted portions of the coating 11 where the insulating base layer 3 was not to be formed on the supporting board 2 and the total-light-transmitting portions 12b confronted portions of the coating 11 where the insulating base layer 3 was to be formed on the supporting board 2. Then, the coating 11 was exposed to ultraviolet light (an integrated quantity of exposure light of 720 mJ/cm$^2$) (Cf. FIG. 3(b)).

Then, after heated (for three minutes at 160° C.), the coating 11 exposed to light was developed using alkaline developer, so that the coating 11 was formed in such a predetermined pattern that could allow the marginal portions of the supporting board 2 to be exposed (Cf. FIG. 3(c)). Thereafter, the coating 11 was heated at 420° C. to thereby form the insulating base layer 3 of polyimide resin having a thickness of 10 μm (Cf. FIG. 3(d)).

Then, a thin chromium film and a thin copper film were sequentially formed on the surface of the supporting board 2 exposed from the insulating base layer 3 and on the entire surface of the insulating base layer 3 by the sputtering process to form the thin metal film 14 having thickness of 300-1,000 Å (Cf. FIG. 4(a)). Then, after laminated on the surface of the thin metal film 14, the dry film photoresist was exposed to ultraviolet light (an integrated quantity of exposure light of 235 mJ/cm$^2$) and then developed by alkaline developer to form the plating resist 15 having the reverse pattern to the conductive pattern 4 on the thin metal film 14 (Cf. FIG. 4(b)).

Then, the conductive pattern 4 having thickness of 10 μm was formed on the surface of the thin metal film 14 exposed from the plating resist 15 by electrolytic copper plating (Cf. FIG. 4(c)). Thereafter, the plating resist 15 was stripped (Cf. FIG. 4(d)) and then the thin metal film 14 exposed from the conductive pattern 4 was removed by chemical etching (Cf. FIG. 4(e)).

As a result of these processes, the conductive pattern 4 wherein the lines of wire 4a, 4b, 4c, 4d, the magnetic head connecting terminals 7, and the external connecting terminals 8 were integrally formed was formed. The width of the each external connecting terminal 8 was 450 μm, and the interval between adjacent external connecting terminals 8 was 300 μm. Also, the first through holes 9 were formed in the external connecting terminals 8. The diameter of the each first through hole 9 was 150 μm.

Then, after the surface of the conductive pattern 4 was activated by palladium solution, the nickel plating layer having thickness of 0.05 μm was formed on the surface thus activated by electrolytic nickel plating. Thereafter, solution of precursor of photosensitive polyimide resin was coated over the entire surface of the nickel plating layer and the insulating base layer 3 and then was heated for two minutes at 120° C., to thereby form the coating 16 of precursor of the photosensitive polyimide resin (Cf. FIG. 5(a)).

Thereafter, the photo mask 17 was disposed opposite the coating 16 so that the light shielding portions 17a confronted portions of the coating 16 where the insulating base layer 3 was not to be formed on the supporting board 2 and portions of the coating 16 corresponding to the magnetic head connecting terminals 7 and the external connecting terminals 8, and the total-light-transmitting portions 17b confronted portions of the coating 16 where the insulating cover layer 10 was to be formed on the insulating base layer 3 including the lines of wire 4a, 4b, 4c, 4d. Then, the coating 16 was exposed to ultraviolet light (an integrated quantity of exposure light of 720 mJ/cm$^2$) (Cf. FIG. 5(b)).

Then, after exposed to light and then heated (for three minutes at 160° C.), the coating 16 exposed to light was developed using alkaline developer, so that the coating 16 was formed in such a predetermined pattern that could allow the lines of wire 4a, 4b, 4c, 4d to be covered with the coating 16 and could allow the magnetic head connecting terminals 7 and the external connecting terminals 8 to be exposed therefrom (Cf. FIG. 5(c)). Thereafter, the coating 16 was heated at 420° C. to thereby form the insulating cover layer 10 of polyimide resin having a thickness of 4 μm (Cf. FIG. 5(d)).

Then, after laminated, the dry film photoresist was exposed to ultraviolet light (an integrated quantity of exposure light of 105 mJ/cm$^2$) and then developed by alkaline developer. After the entire area of the suspension board with circuit 1, except the portions of the supporting board 2 where the third through holes 20 were to be formed, was covered with the dry film photoresist, the portions of the supporting board 2 where the third through holes 20 were to be formed were chemically etched to form the third through holes 20 (Cf. FIG. 2(e)).

Further, the portions of the insulating base layer 3 where the second through holes 19 were to be formed were chemically etched to form the second through holes 19 (Cf. FIG. 2(f)).

Then, after the nickel plating layer on the surface of the magnetic head connecting terminals 7 and on the surface of the external connecting terminals 8 was removed by chemical etching, the dry film photoresist was laminated thereon. Then, the lamination was exposed to ultraviolet light (an integrated quantity of exposure light of 105 mJ/cm$^2$) and then developed using alkaline developer. After the supporting board 2 was covered with the dry film photoresist to cover the outer shape of the suspension board with circuit 1, the supporting board 2 thus covered was etched using ferric chloride solution to cut out to form the gimbal 5 and trimmed along the outer shape of the suspension board with circuit 1.

Thereafter, the plating layer 18 of 3 μm thick comprising the nickel plating layer and the gold plating layer was formed on the respective magnetic head connecting terminals 7 and on the respective external connecting terminals 8 by electroless nickel plating and by electroless gold plating (Cf. FIG. 2(g)).

Example 2

The supporting board 2 of a stainless foil (SUS304) of 300 mm wide and 25 μm thick was prepared (Cf. FIG. 10(a)).

Then, after solution of precursor of photosensitive polyimide resin (photosensitive polyamic acid resin) was coated over the entire surface of the supporting board 2, the coated resin was heated for two minutes at 120° C., to form the coating 11 of the precursor of the photosensitive polyimide resin (Cf. FIG. 11(a)).

Thereafter, the photo mask 27 was disposed opposite the coating 11 so that the light shielding portions 27a confronted portions of the coating 11 where the insulating base layer 3 was not to be formed on the supporting board 2; the total-light-transmitting portions 27b confronted portions of the coating 11 where the insulating base layer 3 was to be formed on the supporting board 2; and the semi-light-transmitting portions 27c confronted portions of the coating 11 where the second through holes 19 were to be formed in the external connecting terminals 8. Then, the coating 11 was exposed to ultraviolet light (an integrated quantity of exposure light of 720 mJ/cm$^2$) (Cf. FIG. 11(b)).

Then, after exposed to light and then heated (for three minutes at 160° C.), the coating 11 exposed to light was developed using alkaline developer, so that the coating 11 was formed in such a predetermined pattern that could allow the marginal portions of the supporting board 2 to be exposed and could allow the second-through-hole-19-forming portions to be smaller in thickness than the remaining portions (Cf. FIG. 11(c)). Thereafter, the coating 11 was heated at 420° C. to thereby form the insulating base layer 3 of polyimide resin having a thickness of 10 μm (Cf. FIG. 11(d)).

Then, the thin chromium film and the thin copper film were sequentially formed on the surface of the supporting board 2 exposed from the insulating base layer 3 and on the entire surface of the insulating base layer 3 by the sputtering process to form the thin metal film 14 having thickness of 300-1,000 Å (Cf. FIG. 12(a)). Then, after laminated on the surface of the thin metal film 14, the dry film photoresist was exposed to ultraviolet light (an integrated quantity of exposure light of 235 mJ/cm$^2$) and then developed by alkaline developer to form the plating resist 15 having the reverse pattern to the conductive pattern 4 on the thin metal film 14 (Cf. FIG. 12(b)).

Then, the conductive pattern 4 having thickness of 10 μm was formed on the surface of the thin metal film 14 exposed from the plating resist 15 by electrolytic copper plating (Cf. FIG. 12(c)). Thereafter, the plating resist 15 was stripped (Cf. FIG. 12(d)) and then the thin metal film 14 exposed from the conductive pattern 4 was removed by chemical etching (Cf. FIG. 12(e)).

As a result of these processes, the conductive pattern 4 wherein the lines of wire 4a, 4b, 4c, 4d, the magnetic head connecting terminals 7, and the external connecting terminals 8 were integrally formed was formed. The width of the each external connecting terminal 8 was 450 μm, and the interval between adjacent external connecting terminals 8 was 300 μm. Also, the first through holes 9 and the shouldered portions 26 were formed in the external connecting terminals 8. The diameter of the each first through hole was 150 μm.

Then, after the surface of the conductive pattern 4 was activated by palladium solution, the nickel plating layer having thickness of 0.05 μm was formed on the surface thus activated by electrolytic nickel plating. Thereafter, solution of precursor of photosensitive polyimide resin was coated over the entire surface of the nickel plating layer and the insulating base layer 3 and then was heated for two minutes at 120° C., to thereby form the coating 16 of precursor of the photosensitive polyimide resin (Cf. FIG. 13(a)).

Thereafter, the photo mask 17 was disposed opposite the coating 16 so that the light shielding portions 17a confronted portions of the coating 16 where the insulating base layer 3 was not to be formed on the supporting board 2 and portions of the coating 16 corresponding to the magnetic head connecting terminals 7 and the external connecting terminals 8, and the total-light-transmitting portions 17b confronted portions of the coating 16 where the insulating cover layer 10 was to be formed on the insulating base layer 3 including the lines of wire 4a, 4b, 4c, 4d. Then, the coating 16 was exposed to ultraviolet light (an integrated quantity of exposure light of 720 mJ/cm$^2$) (Cf. FIG. 13(b)).

Then, after exposed to light and then heated (for three minutes at 160° C.), the coating 16 exposed to light was developed using alkaline developer, so that the coating 16 was formed in such a predetermined pattern that could allow the lines of wire 4a, 4b, 4c, 4d to be covered with the coating 16 and could allow the magnetic head connecting terminals 7 and the external connecting terminals 8 to be exposed therefrom (Cf. FIG. 13(c)). Thereafter, the coating 16 was heated at 420° C. to thereby form the insulating cover layer 10 of polyimide resin having a thickness of 4 μm (Cf. FIG. 13(d)).

Then, after laminated, the dry film photoresist was exposed to ultraviolet light (an integrated quantity of exposure light of 105 mJ/cm$^2$) and then developed by alkaline developer. After the entire area of the suspension board with circuit 1, except the portions of the supporting board 2 where the third through holes 20 were to be formed, was covered with the dry film photoresist, the portions of the supporting board 2 where the third through holes 20 were to be formed were chemically etched to form the third through holes 20 (Cf. FIG. 10(e)).

Further, the portions of the insulating base layer 3 where the second through holes 19 were to be formed were also chemically etched to form the second through holes 19 (Cf. FIG. 10(f)).

Then, after the nickel plating layer on the surface of the magnetic head connecting terminals 7 and on the surface of the external connecting terminals 8 was removed by chemical etching, the dry film photoresist was laminated thereon. Then, the lamination was exposed to ultraviolet light (an integrated quantity of exposure light of 105 mJ/cm$^2$) and then developed using alkaline developer. After the supporting board 2 was covered with the dry film photoresist to cover the outer shape of the suspension board with circuit 1, the supporting board 2 thus covered was etched using ferric chloride solution to cut out to form the gimbal 5 and trimmed along the outer shape of the suspension board with circuit 1.

Thereafter, the plating layer 18 of 3 μm thick comprising the nickel plating layer and the gold plating layer was formed on the respective magnetic head connection terminals 7 and on the respective external connecting terminals 8 by electroless nickel plating and by electroless gold plating (Cf. FIG. 10(g)).

Comparative Example 1

Figure 21:
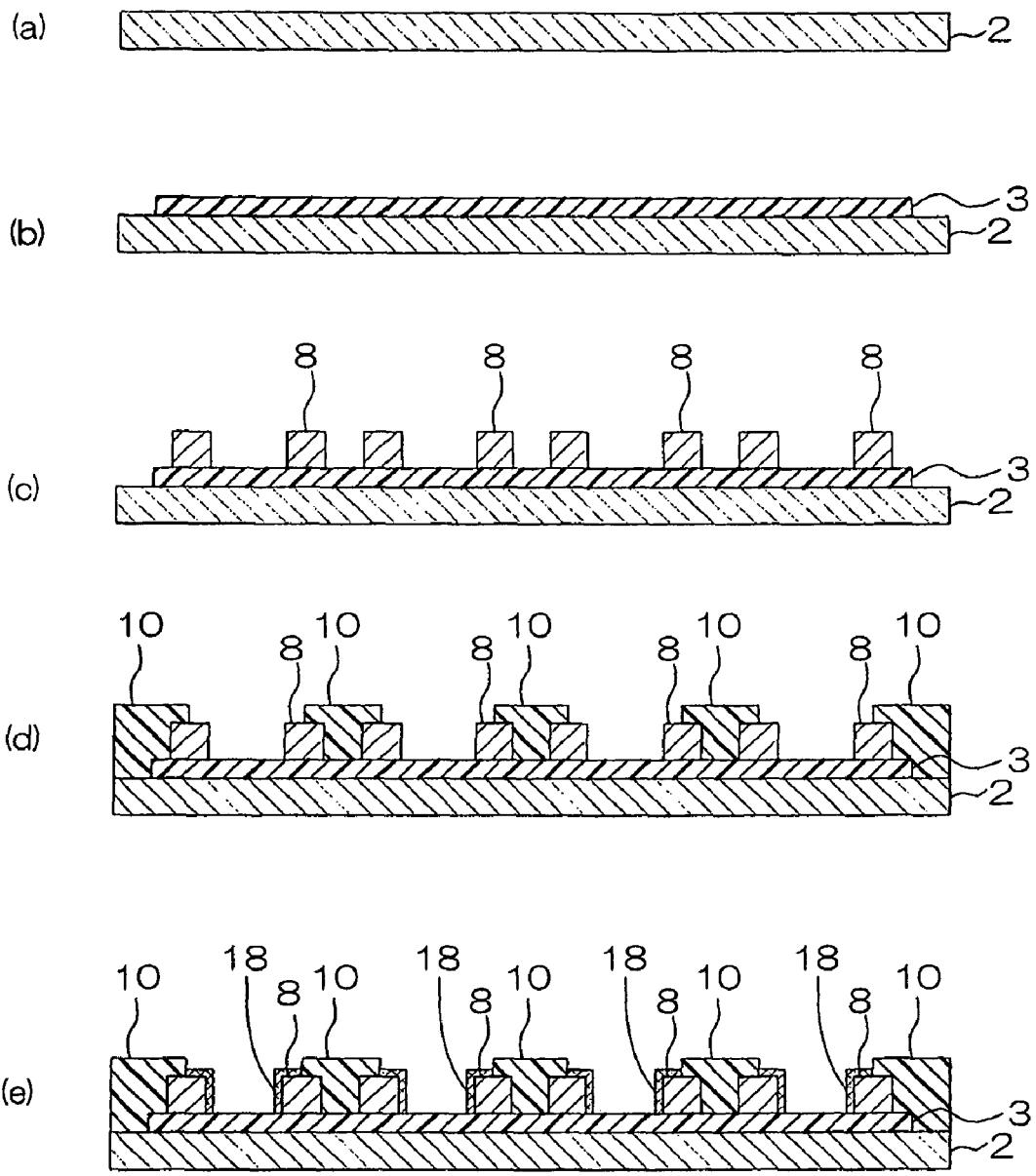
FIG. 21 is a process drawing showing a production method of a suspension board with circuit of Comparative Example 1, (a) showing the process of preparing a supporting board, (b) showing the process of forming an insulating base layer of a predetermined pattern on the supporting board, (c) showing the process of forming a conductive pattern on the insulating base layer, (d) showing the process of forming an insulating cover layer of a predetermined pattern on the insulating base layer, and (e) showing the process of forming a plating layer on each magnetic head connecting terminal and each external connecting terminal.

The supporting board 2 of a stainless foil (SUS304) of 300 mm wide and 25 μm thick was prepared (Cf. FIG. 21(a)).

Then, the insulating base layer 3 of polyimide resin was formed by the same processes as in Example 1 (Cf. FIG. 21(b)).

Then, the conductive pattern 4 wherein the lines of wire 4a, 4b, 4c, 4d, the magnetic head connecting terminals 7, and the external connecting terminals 8 were integrally formed on the insulating base layer 3 was formed by the same processes as in Example 1 (Cf. FIG. 21(c)). The first through holes 19 were formed in the external connecting terminals 8, as is the case with Example 1.

Then, after the nickel plating layer of 0.05 μm thick was formed on the surface of the conductive pattern 4 by the same processes as in Example 1, the insulating cover layer 10 of polyimide resin, with which the lines of wire 4a, 4b, 4c, 4d were covered and from which the magnetic head connecting terminals 7 and the external connecting terminals 8 were exposed, was formed on the insulating base layer 3 (Cf. FIG. 21(d)).

Then, after the nickel plating layer on the surface of the magnetic head connecting terminals 7 and on the surface of the external connecting terminals 8 was removed by the same process as in Example 1, the suspension board with circuit 1 was cut out to form the gimbal 5 and trimmed along the outer shape thereof. Thereafter, the plating layer 18 comprising the nickel plating layer and the gold plating layer was formed (Cf. FIG. 21(e)).

Comparative Example 2

Figure 22:
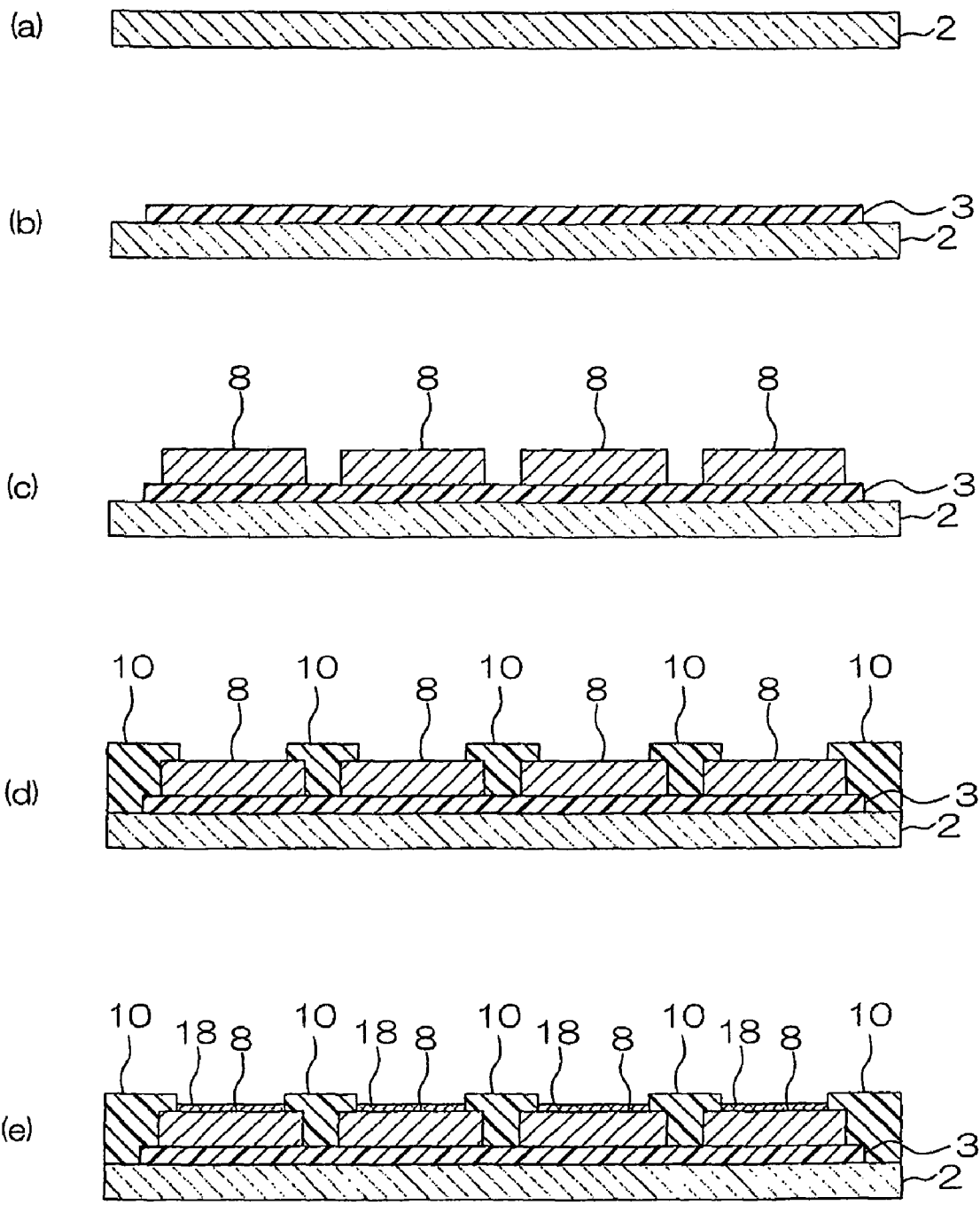
FIG. 22 is a process drawing showing a production method of a suspension board with circuit of Comparative Example 2, (a) showing the process of preparing a supporting board, (b) showing the process of forming an insulating base layer of a predetermined pattern on the supporting board, (c) showing the process of forming a conductive pattern on the insulating base layer, (d) showing the process of forming an insulating cover layer of a predetermined pattern on the insulating base layer, and (e) showing the process of forming a plating layer on each magnetic head connecting terminal and each external connecting terminal

The supporting board 2 of a stainless foil (SUS304) of 300 mm wide and 25 μm thick was prepared (Cf. FIG. 22(a)).

Then, the insulating base layer 3 of polyimide resin was formed by the same processes as in Example 1 (Cf. FIG. 22(b)).

Then, the conductive pattern 4 wherein the lines of wire 4a, 4b, 4c, 4d, the magnetic head connecting terminals 7, and the external connecting terminals 8 were integrally formed on the insulating base layer 3 was formed by the same processes as in Example 1 (Cf. FIG. 22(c)). The external connecting terminals 8 were formed to have uniform thickness without forming the first through holes 9.

Then, after the nickel plating layer of 0.05 μm thick was formed on the surface of the conductive pattern 4 by the same processes as in Example 1, the insulating cover layer of polyimide resin, with which the lines of wire 4a, 4b, 4c, 4d were covered and from which the magnetic head connecting terminals 7 and the external connecting terminals 8 were exposed, was formed on the insulating base layer 3 (Cf. FIG. 22(d)).

Then, after the nickel plating layer on the surface of the magnetic head connecting terminals 7 and on the surface of the external connecting terminals 8 was removed by the same process as in Example 1, the suspension board with circuit I was cut out to form the gimbal 5 and trimmed along the outer shape thereof. Thereafter, the plating layer 18 comprising the nickel plating layer and the gold plating layer was formed (Cf. FIG. 22(e)).

Evaluation

The external connecting terminals 8 of the suspension boards with circuits obtained in Examples 1 and 2 and Comparative Examples 1 and 2 were connected with the connecting terminals of the read/write substrate via the solder balls 21. The suspension board with circuit of each of Examples 1 and 2 was able to be connected with the read/write substrate reliably. However, in the suspension board with circuit of Comparative Example 1, electrical conductive failure occurred, and in the suspension board with circuit of Comparative Example 2, the solder balls 21 were rolled down, thus producing reduced working efficiency in the connecting process.

While the illustrative embodiments of the present invention are provided in the above description, such is for illustrative purpose only and it is not to be construed restrictively. Modification and variation of the present invention that will be obvious to those skilled in the art is to be covered by the following claims.

What is claimed is:

1. A method of manufacturing a wired circuit board, comprising:
    forming an insulating layer in a pattern thereby forming second through holes penetrating the insulating layer in a thickness direction thereof; and
    after forming the insulating layer, forming, on the insulating layer, a conductive pattern in a pattern having terminals which are continuous with an upper surface and a side surface of a side end portion of the insulating layer such that the terminals extend into the second through holes, the terminals being operative for connecting with external terminals via a molten metal, the terminals including annular, step-shaped shoulder portions aligned with the second through holes and that are recessed downward from an upper surface, and first through holes having a diameter smaller than that of the second through holes and which pass through the terminals in a thickness direction thereof.

2. The method of manufacturing a wired circuit board according to claim 1, further comprising forming an insulating cover layer on the insulating layer in a pattern such that the conductive pattern is covered but the terminals are exposed.

3. The method of manufacturing a wired circuit board according to claim 1, further comprising forming a plating layer on the terminals to cover their surfaces including the shoulder portions.

* * * * *